US011990199B2

(12) United States Patent
Song et al.

(10) Patent No.: US 11,990,199 B2
(45) Date of Patent: May 21, 2024

(54) CENTRALIZED ERROR CORRECTION CIRCUIT

(71) Applicant: Micron Technology, Inc., Boise, ID (US)

(72) Inventors: Taeksang Song, San Jose, CA (US); Saira Samar Malik, Lafayette, IN (US); Hyunyoo Lee, Boise, ID (US); Chinnakrishnan Ballapuram, San Jose, CA (US); Kang-Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/647,152

(22) Filed: Jan. 5, 2022

(65) Prior Publication Data

US 2022/0230698 A1    Jul. 21, 2022

Related U.S. Application Data

(60) Provisional application No. 63/140,096, filed on Jan. 21, 2021.

(51) Int. Cl.
*G11C 29/42* (2006.01)
*G11C 29/12* (2006.01)
*G11C 29/44* (2006.01)

(52) U.S. Cl.
CPC .......... *G11C 29/42* (2013.01); *G11C 29/1201* (2013.01); *G11C 29/4401* (2013.01)

(58) Field of Classification Search
CPC . G11C 29/42; G11C 29/1201; G11C 29/4401; G11C 29/52; G11C 2029/0411; G06F 11/1048
See application file for complete search history.

(56) References Cited

U.S. PATENT DOCUMENTS

| | | | | |
|---|---|---|---|---|
| 5,515,333 A | * | 5/1996 | Fujita | G11C 29/765 365/228 |
| 8,762,813 B2 | * | 6/2014 | Tang | H03M 13/1105 714/763 |
| 2007/0220354 A1 | * | 9/2007 | Moyer | G06F 11/1052 714/E11.05 |
| 2010/0180182 A1 | * | 7/2010 | Trantham | G06F 11/1068 714/799 |
| 2012/0297147 A1 | * | 11/2012 | Mylly | G06F 12/0246 711/143 |
| 2020/0042223 A1 | * | 2/2020 | Li | G11C 29/52 |

* cited by examiner

*Primary Examiner* — Steve N Nguyen
(74) *Attorney, Agent, or Firm* — Holland & Hart LLP

(57) ABSTRACT

Methods, systems, and devices for centralized error correction circuit are described. An apparatus may include a non-volatile memory disposed on a first die and a volatile memory disposed on a second die (different than the first die). The apparatus may also include an interface controller disposed on a third die (different than the first die and the second die). The interface controller may be coupled with the non-volatile memory and the volatile memory and may include an error correction circuit that is configured to operate on one or more codewords received from the volatile memory.

20 Claims, 9 Drawing Sheets

CENTRALIZED ERROR CORRECTION CIRCUIT

CROSS REFERENCE

The present application for patent claims the benefit of U.S. Provisional Patent Application No. 63/140,096 by SONG et al., entitled "CENTRALIZED ERROR CORRECTION CIRCUIT," filed Jan. 21, 2021, assigned to the assignee hereof, and expressly incorporated by reference in its entirety herein.

FIELD OF TECHNOLOGY

The following relates generally to one or more systems for memory and more specifically to centralized error correction circuit.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

A device, such as an electronic device, may include a non-volatile memory (e.g., a primary memory for storing information, among other operations) and a volatile memory (e.g., a secondary memory) that may operate as a cache for the non-volatile memory. Such a configuration may allow the device to benefit from advantages of the non-volatile memory (e.g., non-volatility and persistent storage, high storage capacity, low power consumption) while maintaining compatibility with a host device through the volatile memory. The volatile memory may be disposed on a memory die and may include multiple banks. To increase reliability, each bank of the volatile memory may be coupled with a respective error correction code (ECC) circuit on the memory die that detects and corrects errors in data read from that bank. But including ECC circuits on the memory die reduces the area of the memory die that can be used for other components, such as memory cells, which reduces the capacity of the volatile memory.

According to the techniques described herein, the capacity of the volatile memory may be increased, and other advantages may be realized, by including an ECC circuit for the volatile memory on the die (e.g., substrate) of a memory controller coupled with the volatile memory. Such a configuration may be referred to herein as a centralized ECC circuit. The centralized ECC circuit may be configured to operate on codewords from some or all of the banks of the volatile memory and may be relatively faster than other ECC circuits (e.g., ECC circuits disposed on a memory die) due to more efficient and effective processes associated with manufacturing the memory controller. In some examples, a second centralized ECC circuit may also be used for the non-volatile memory of the device to increase the capacity (or decrease the physical size) of the non-volatile memory (e.g., relative to a non-volatile memory that includes one or more on-die ECC circuits), among other benefits.

Features of the disclosure are initially described in the context of a system and subsystem as described with reference to FIGS. 1 and 2. Features of the disclosure are described in the context of a device, as described with reference to FIG. 3, and process flows, as described with reference to FIGS. 4-6. These and other features of the disclosure are further illustrated by and described with reference to an apparatus diagram and flowcharts that relate to a centralized ECC circuit as described with reference to FIGS. 7-8.

Figure 1:
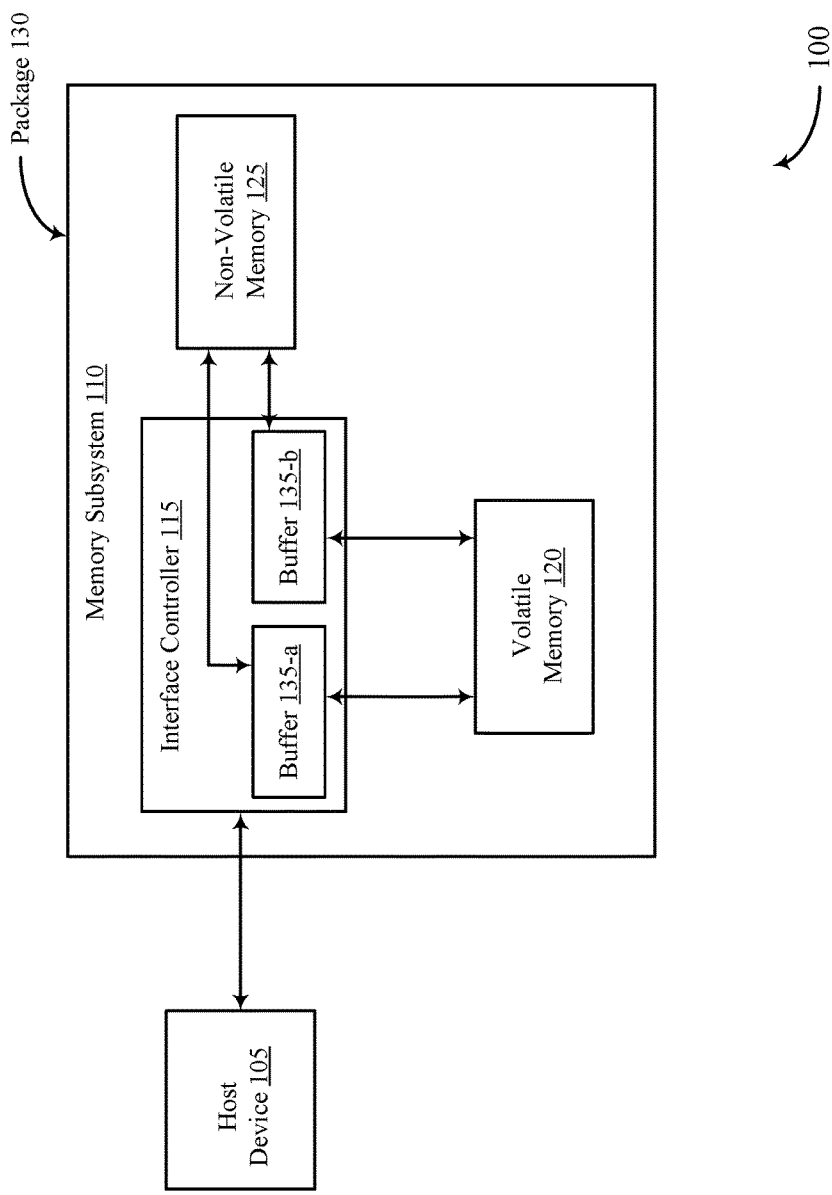
FIG. 1 illustrates an example of a system that supports centralized error correction circuit in accordance with examples as disclosed herein.

FIG. 1 illustrates an example of a system 100 that supports centralized error correction circuit in accordance with examples as disclosed herein. The system 100 may be included in an electronic device such a computer or phone. The system 100 may include a host device 105 and a memory subsystem 110. The host device 105 may be a processor or system-on-a-chip (SoC) that interfaces with the interface controller 115 as well as other components of the electronic device that includes the system 100. The memory subsystem 110 may store and provide access to electronic information (e.g., digital information, data) for the host device 105. The memory subsystem 110 may include an interface controller 115, a volatile memory 120, and a non-volatile memory 125. In some examples, the interface controller 115, the volatile memory 120, and the non-volatile memory 125 may be included in a same physical package such as a package 130. However, the interface controller 115, the volatile memory 120, and the non-volatile memory 125 may be disposed on different, respective dies (e.g., silicon dies).

The devices in the system 100 may be coupled by various conductive lines (e.g., traces, printed circuit board (PCB) routing, redistribution layer (RDL) routing) that may enable the communication of information (e.g., commands, addresses, data) between the devices. The conductive lines may make up channels, data buses, command buses, address buses, and the like.

The memory subsystem 110 may be configured to provide the benefits of the non-volatile memory 125 while maintaining compatibility with a host device 105 that supports protocols for a different type of memory, such as the volatile memory 120, among other examples. For example, the non-volatile memory 125 may provide benefits (e.g., relative to the volatile memory 120) such as non-volatility, higher capacity, or lower power consumption. But the host device 105 may be incompatible or inefficiently configured with various aspects of the non-volatile memory 125. For instance, the host device 105 may support voltages, access latencies, protocols, page sizes, etc. that are incompatible with the non-volatile memory 125. To compensate for the incompatibility between the host device 105 and the non-volatile memory 125, the memory subsystem 110 may be configured with the volatile memory 120, which may be compatible with the host device 105 and serve as a cache for the non-volatile memory 125. Thus, the host device 105 may use protocols supported by the volatile memory 120 while benefitting from the advantages of the non-volatile memory 125.

In some examples, the system 100 may be included in, or coupled with, a computing device, electronic device, mobile computing device, or wireless device. The device may be a portable electronic device. For example, the device may be a computer, a laptop computer, a tablet computer, a smartphone, a cellular phone, a wearable device, an internet-connected device, or the like. In some examples, the device may be configured for bi-directional wireless communication via a base station or access point. In some examples, the device associated with the system 100 may be capable of machine-type communication (MTC), machine-to-machine (M2M) communication, or device-to-device (D2D) communication. In some examples, the device associated with the system 100 may be referred to as a user equipment (UE), station (STA), mobile terminal, or the like.

The host device 105 may be configured to interface with the memory subsystem 110 using a first protocol (e.g., low-power double data rate (LPDDR)) supported by the interface controller 115. Thus, the host device 105 may, in some examples, interface with the interface controller 115 directly and the non-volatile memory 125 and the volatile memory 120 indirectly. In alternative examples, the host device 105 may interface directly with the non-volatile memory 125 and the volatile memory 120. The host device 105 may also interface with other components of the electronic device that includes the system 100. The host device 105 may be or include an SoC, a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In some examples, the host device 105 may be referred to as a host.

The interface controller 115 may be configured to interface with the volatile memory 120 and the non-volatile memory 125 on behalf of the host device 105 (e.g., based on or in response to one or more commands or requests issued by the host device 105). For instance, the interface controller 115 may facilitate the retrieval and storage of data in the volatile memory 120 and the non-volatile memory 125 on behalf of the host device 105. Thus, the interface controller 115 may facilitate data transfer between various subcomponents, such as between at least some of the host device 105, the volatile memory 120, or the non-volatile memory 125. The interface controller 115 may interface with the host device 105 and the volatile memory 120 using the first protocol and may interface with the non-volatile memory 125 using a second protocol supported by the non-volatile memory 125.

The non-volatile memory 125 may be configured to store digital information (e.g., data) for the electronic device that includes the system 100. Accordingly, the non-volatile memory 125 may include an array or arrays of memory cells and a local memory controller configured to operate the array(s) of memory cells. In some examples, the memory cells may be or include FeRAM cells (e.g., the non-volatile memory 125 may be FeRAM). The non-volatile memory 125 may be configured to interface with the interface controller 115 using the second protocol that is different than the first protocol used between the interface controller 115 and the host device 105. In some examples, the non-volatile memory 125 may have a longer latency for access operations than the volatile memory 120. For example, retrieving data from the non-volatile memory 125 may take longer than retrieving data from the volatile memory 120. Similarly, writing data to the non-volatile memory 125 may take longer than writing data to the volatile memory 120. In some examples, the non-volatile memory 125 may have a smaller page size than the volatile memory 120, as described herein.

The volatile memory 120 may be configured to operate as a cache for one or more components, such as the non-volatile memory 125. For example, the volatile memory 120 may store information (e.g., data) for the electronic device that includes the system 100. Accordingly, the volatile memory 120 may include an array or arrays of memory cells and a local memory controller configured to operate the array(s) of memory cells. In some examples, the memory cells may be or include DRAM cells (e.g., the volatile memory may be DRAM). The non-volatile memory 125 may be configured to interface with the interface controller 115 using the first protocol that is used between the interface controller 115 and the host device 105.

In some examples, the volatile memory 120 may have a shorter latency for access operations than the non-volatile memory 125. For example, retrieving data from the volatile memory 120 may take less time than retrieving data from the non-volatile memory 125. Similarly, writing data to the volatile memory 120 may take less time than writing data to the non-volatile memory 125. In some examples, the volatile memory 120 may have a larger page size than the non-volatile memory 125. For instance, the page size of volatile memory 120 may be 2 kilobytes (2 kB) and the page size of non-volatile memory 125 may be 64 bytes (64B) or 128 bytes (128B).

Although the non-volatile memory 125 may be a higher-density memory than the volatile memory 120, accessing the non-volatile memory 125 may take longer than accessing the volatile memory 120 (e.g., due to different architectures and protocols, among other reasons). Accordingly, operating the volatile memory 120 as a cache may reduce latency in the system 100. As an example, an access request for data from the host device 105 may be satisfied relatively quickly by retrieving the data from the volatile memory 120 rather than from the non-volatile memory 125. To facilitate operation of the volatile memory 120 as a cache, the interface controller 115 may include multiple buffers 135. The buffers 135 may be disposed on the same die as the interface controller 115 and may be configured to temporarily store data for transfer between the volatile memory 120, the non-volatile memory 125, or the host device 105 (or any combination thereof) during one or more access operations (e.g., storage and retrieval operations).

An access operation may also be referred to as an access process or access procedure and may involve one or more sub-operations that are performed by one or more of the components of the memory subsystem 110. Examples of access operations may include storage operations in which data provided by the host device 105 is stored (e.g., written to) in the volatile memory 120 or the non-volatile memory 125 (or both), and retrieval operations in which data requested by the host device 105 is obtained (e.g., read) from the volatile memory 120 or the non-volatile memory 125 and is returned to the host device 105.

To store data in the memory subsystem 110, the host device 105 may initiate a storage operation (or "storage process") by transmitting a storage command (also referred to as a storage request, a write command, or a write request) to the interface controller 115. The storage command may target a set of non-volatile memory cells in the non-volatile memory 125. In some examples, a set of memory cells may also be referred to as a portion of memory. The host device 105 may also provide the data to be written to the set of non-volatile memory cells to the interface controller 115. The interface controller 115 may temporarily store the data in the buffer 135-a. After storing the data in the buffer 135-a, the interface controller 115 may transfer the data from the buffer 135-a to the volatile memory 120 or the non-volatile memory 125 or both. In write-through mode, the interface controller 115 may transfer the data to both the volatile memory 120 and the non-volatile memory 125. In write-back mode, the interface controller 115 may only transfer the data to the volatile memory 120 (with the data being transferred to the non-volatile memory 125 during a later eviction process).

In either mode, the interface controller 115 may identify an appropriate set of one or more volatile memory cells in the volatile memory 120 for storing the data associated with the storage command. To do so, the interface controller 115 may implement set-associative mapping in which each set (e.g., block) of one or more non-volatile memory cells in the non-volatile memory 125 may be mapped to multiple sets of volatile memory cells in the volatile memory 120. For instance, the interface controller 115 may implement n-way associative mapping which allows data from a set of non-volatile memory cells to be stored in one of n sets of volatile memory cells in the volatile memory 120. Thus, the interface controller 115 may manage the volatile memory 120 as a cache for the non-volatile memory 125 by referencing the n sets of volatile memory cells associated with a targeted set of non-volatile memory cells. As used herein, a "set" of objects may refer to one or more of the objects unless otherwise described or noted. Although described with reference to set-associative mapping, the interface controller 115 may manage the volatile memory 120 as a cache by implementing one or more other types of mapping such as direct mapping or associative mapping, among other examples.

After determining which n sets of volatile memory cells are associated with the targeted set of non-volatile memory cells, the interface controller 115 may store the data in one or more of the n sets of volatile memory cells. This way, a subsequent retrieval command from the host device 105 for the data can be efficiently satisfied by retrieving the data from the lower-latency volatile memory 120 instead of retrieving the data from the higher-latency non-volatile memory 125. The interface controller 115 may determine which of the n sets of the volatile memory 120 to store the data based on or in response to determining one or more parameters associated with the data stored in the n sets of the volatile memory 120, such as the validity, age, or modification status of the data. Thus, a storage command by the host device 105 may be wholly (e.g., in write-back mode) or partially (e.g., in write-through mode) satisfied by storing the data in the volatile memory 120. To track the data stored in the volatile memory 120, the interface controller 115 may store for one or more sets of volatile memory cells (e.g., for each set of volatile memory cells) a tag address that indicates the non-volatile memory cells with data stored in a given set of volatile memory cells.

To retrieve data from the memory subsystem 110, the host device 105 may initiate a retrieval operation (also referred to as a retrieval process) by transmitting a retrieval command (also referred to as a retrieval request, a read command, or a read request) to the interface controller 115. The retrieval command may target a set of one or more non-volatile memory cells in the non-volatile memory 125. Upon receiving the retrieval command, the interface controller 115 may check for the requested data in the volatile memory 120. For instance, the interface controller 115 may check for the requested data in the n sets of volatile memory cells associated with the targeted set of non-volatile memory cells. If one of the n sets of volatile memory cells stores the requested data (e.g., stores data for the targeted set of non-volatile memory cells), the interface controller 115 may transfer the data from the volatile memory 120 to the buffer 135-a (e.g., in response to determining whether one of the n sets of volatile memory cells stores the requested data, as described in FIGS. 4 and 5) so that it can be transmitted to the host device 105.

In general, the term "hit" may be used to refer to the scenario where the volatile memory 120 stores data targeted by the host device 105. If then sets of one or more volatile memory cells do not store the requested data (e.g., the n sets of volatile memory cells store data for a set of non-volatile memory cells other than the targeted set of non-volatile memory cells), the interface controller 115 may transfer the requested data from the non-volatile memory 125 to the buffer 135-a (e.g., in response to determining whether the n sets of volatile memory cells do not store the requested data, as described with reference to FIGS. 4 and 5) so that it can be transmitted to the host device 105. In general, the term "miss" may be used to refer to the scenario where the volatile memory 120 does not store data targeted by the host device 105.

More specifically, a write hit may refer to the scenario where data in the volatile memory 120 is associated with (e.g., matches data stored at) a non-volatile memory address targeted by a write command from the host device; whereas a write miss may refer to the scenario where data associated with the non-volatile memory address is absent from the volatile memory 120.

In a miss scenario, after transferring the requested data to the buffer 135-a, the interface controller 115 may transfer the requested data from the buffer 135-a to the volatile memory 120 so that subsequent read requests for the data can be satisfied by the volatile memory 120 instead of the non-volatile memory 125. For example, the interface controller 115 may store the data in one of the n sets of volatile memory cells associated with the targeted set of non-volatile memory cells. But the n sets of volatile memory cells may already be storing data for other sets of non-volatile memory cells. So, to preserve this other data, the interface controller 115 may transfer the other data to the buffer 135-b so that it can be transferred to the non-volatile memory 125 for storage. Such a process may be referred to as "eviction" and the data transferred from the volatile memory 120 to the buffer 135-b may be referred to as "victim" data. In some cases, the interface controller 115 may transfer a subset of the victim data from the buffer 135-b to the non-volatile memory 125. For example, the interface controller 115 may transfer one or more subsets of victim data that have changed since the data was initially stored in the non-volatile memory 125. Data that is inconsistent between the volatile memory 120 and the non-volatile memory 125 (e.g., due to an update in one memory and not the other) may be referred to in some cases as "modified" or "dirty" data. In some examples (e.g., if interface controller operates in one mode such as a write-back mode), dirty data may be data that is present in the volatile memory 120 but not present in the non-volatile memory 125.

The system 100 may include any quantity of non-transitory computer readable media that support one or more centralized error correction circuits. For example, the host device 105, the interface controller 115, the volatile memory 120, or the non-volatile memory 125 may include or otherwise may access one or more non-transitory computer readable media storing instructions (e.g., firmware) for performing the functions ascribed herein to the host device 105, the interface controller 115, the volatile memory 120, or the non-volatile memory 125. For example, such instructions, when executed by the host device 105 (e.g., by a host device controller), by the interface controller 115, by the volatile memory 120 (e.g., by a local controller), or by the non-volatile memory 125 (e.g., by a local controller), may cause the host device 105, the interface controller 115, the volatile memory 120, or the non-volatile memory 125 to perform associated functions as described herein.

As noted, the volatile memory 120 may include multiple banks, which may reduce overhead (e.g., storage information used to manage the volatile memory) relative to use of a single bank, among other advantages. The banks of the volatile memory 120 may all be disposed on a single memory die along with control components, such as a controller, and supporting circuitry. To increase reliability, at least some banks if not each bank of the volatile memory 120 may have an associated ECC circuit that is also disposed on the memory die. The ECC circuit associated with a bank may be configured to operate on data from (or for) that bank. However, for various reasons, such as manufacturing limitations associated with the memory die, the ECC circuit for a bank may not be able to correct data as fast as the data can be read (e.g., error correction latency may be longer than the read-out latency). This latency discrepancy may prevent the use of a single on-die ECC circuit for the volatile memory 120, because the ECC circuit may act as a bottle-neck for outgoing data, resulting in gaps in communicating data on an outgoing data bus. But adding additional ECC circuits to the memory die to allow for parallel ECC operations, as described above, reduces the area of the memory die that can be used for memory cells. Additionally, use of per-bank ECC circuits on the memory die may increase power consumption and latency, among other disadvantages.

According to the techniques described herein, the capacity of the volatile memory 120 may be increased relative to other configurations, and power consumption and latency may be reduced, by using an ECC circuit on the die of the interface controller 115 ("controller die") for the volatile memory 120. Due to faster processes associated with the controller die relative to the memory die, the ECC circuit on the controller die may be faster than other ECC circuits (e.g., the error correction latency may be shorter than the data read-out latency), such as those on the memory die, which permits use of the centralized ECC circuit for some or all of the banks of the volatile memory 120. Thus, system capacity, power consumption, and latency may be improved. Although described with reference to the volatile memory 120, the centralized ECC circuit techniques described herein may also be used for the non-volatile memory 125 (e.g., by using an ECC circuit on the die of the interface controller 115 ("controller die") for the non-volatile memory 125, for similar reasons and with similar advantages.

An ECC circuit may also be referred to herein as ECC logic, ECC circuitry, an ECC component, or other suitable terminology. A centralized ECC circuit may also be referred to as an "off-die" die ECC circuit, where the term "off-die" is with respect to a memory die (e.g., a die that may include the volatile memory 120, or the non-volatile memory 125, or both).

Figure 2:
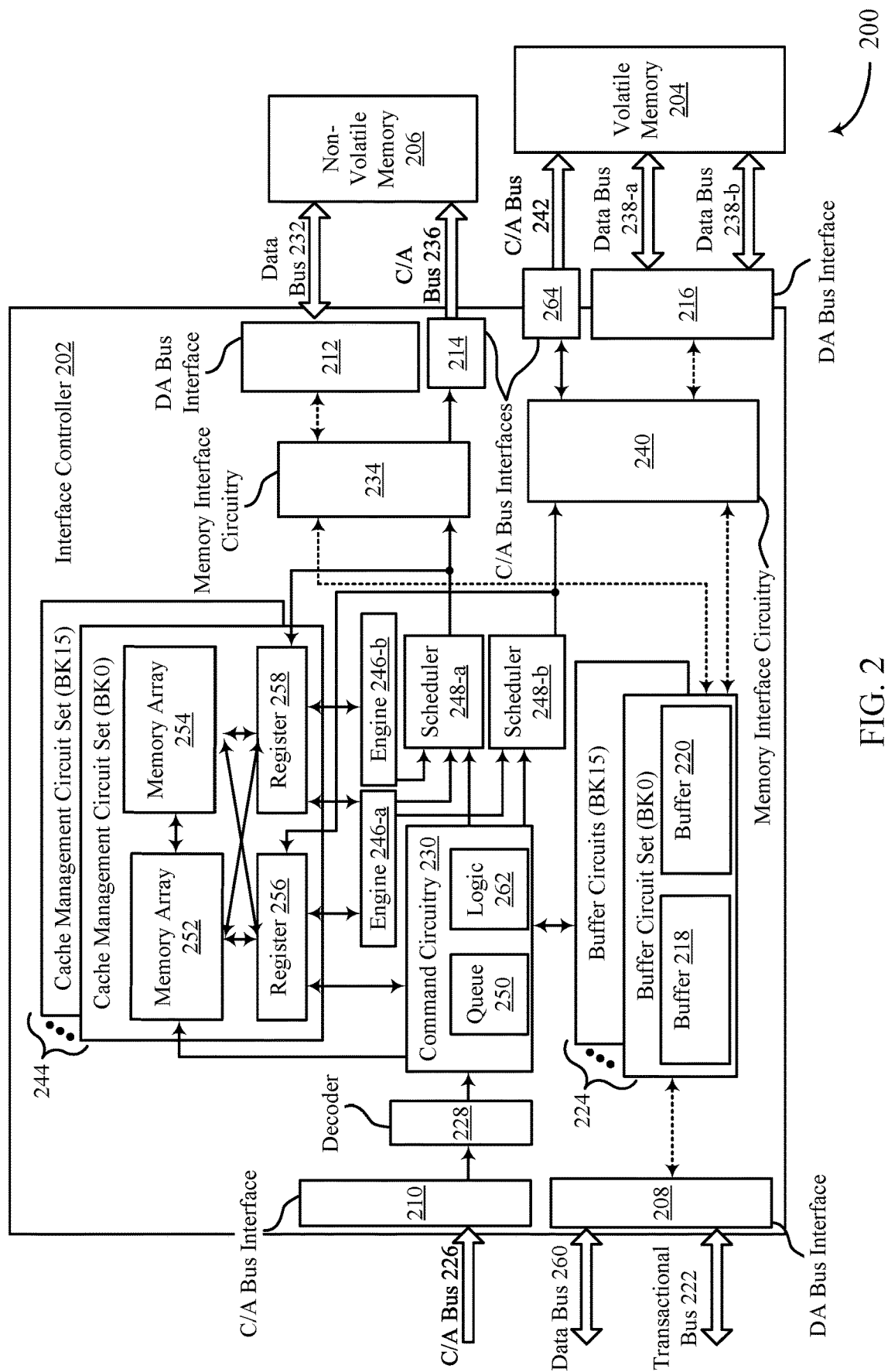
FIG. 2 illustrates an example of a memory subsystem that supports centralized error correction circuit in accordance with examples as disclosed herein.

FIG. 2 illustrates an example of a memory subsystem 200 that supports centralized error correction circuit in accordance with examples as disclosed herein. The memory subsystem 200 may be an example of the memory subsystem 110 described with reference to FIG. 1. Accordingly, the memory subsystem 200 may interact with a host device as described with reference to FIG. 1. The memory subsystem 200 may include an interface controller 202, a volatile memory 204, and a non-volatile memory 206, which may be examples of the interface controller 115, the volatile memory 120, and the non-volatile memory 125, respectively, as described with reference to FIG. 1. Thus, the interface controller 202 may interface with the volatile memory 204 and the non-volatile memory 206 on behalf of the host device as described with reference to FIG. 1. For example, the interface controller 202 may operate the volatile memory 204 as a cache for the non-volatile memory 206. Operating the volatile memory 204 as the cache may allow subsystem to provide the benefits of the non-volatile memory 206 (e.g., non-volatile, high-density storage) while maintaining compatibility with a host device that supports a different protocol than the non-volatile memory 206.

In FIG. 2, dashed lines between components represent the flow of data or communication paths for data and solid lines between components represent the flow of commands or communication paths for commands. In some cases, the memory subsystem 200 is one of multiple similar or identical subsystems that may be included in an electronic device. Each subsystem may be referred to as a slice and may be associated with a respective channel of a host device in some examples.

The non-volatile memory 206 may be configured to operate as a main memory (e.g., memory for long-term data storage) for a host device. In some cases, the non-volatile memory 206 may include one or more arrays of FeRAM cells. Each FeRAM cell may include a selection component and a ferroelectric capacitor and may be accessed by applying appropriate voltages to one or more access lines such as word lines, plates lines, and digit lines. In some examples, a subset of FeRAM cells coupled with to an activated word line may be sensed, for example concurrently or simultaneously, without having to sense all FeRAM cells coupled with the activated word line. Accordingly, a page size for an FeRAM array may be different than (e.g., smaller than) a DRAM page size. In the context of a memory device, a page may refer to the memory cells in a row (e.g., a group of the memory cells that have a common row address) and a page size may refer to the number of memory cells or column addresses in a row, or the number of column addresses accessed during an access operation. Alternatively, a page size may refer to a size of data handled by various interfaces or the amount of data a row is capable of storing. In some cases, different memory device types may have different page sizes. For example, a DRAM page size (e.g., 2 kB) may be a superset of a non-volatile memory (e.g., FeRAM) page size (e.g., 64B).

A smaller page size of an FeRAM array may provide various efficiency benefits, as an individual FeRAM cell may need more power to read or write than an individual DRAM cell. For example, a smaller page size for an FeRAM array may facilitate effective energy usage because a smaller number of FeRAM cells may be activated if an associated change in information is minor. In some examples, the page size for an array of FeRAM cells may vary, for example dynamically (e.g., during operation of the array of FeRAM cells) depending on the nature of data and command utilizing FeRAM operation.

Although an individual FeRAM cell may need more power to read or write than an individual DRAM cell, an FeRAM cell may maintain its stored logic state for an extended period of time in the absence of an external power source, as the ferroelectric material in the FeRAM cell may maintain a non-zero electric polarization in the absence of an electric field. Therefore, including an FeRAM array in the non-volatile memory 206 may provide power and efficiency benefits relative to volatile memory cells (e.g., DRAM cells in the volatile memory 204), as it may reduce or eliminate requirements to perform refresh operations.

The volatile memory 204 may be configured to operate as a cache for the non-volatile memory 206. In some cases, the volatile memory 204 may include one or more arrays of DRAM cells. Each DRAM cell may include a capacitor that includes a dielectric material to store a charge representative of the programmable state. The memory cells of the volatile memory 204 may be logically grouped or arranged into one or more memory banks (as referred to herein as "banks"). For example, volatile memory 204 may include sixteen banks. The memory cells of a bank may be arranged in a grid or an array of intersecting columns and rows and each memory cell may be accessed or refreshed by applying appropriate voltages to the digit line (e.g., column line) and word line (e.g., row line) for that memory cell. The rows of a bank may be referred to pages, and the page size may refer to the number of columns or memory cells in a row (and thus, the amount of data a row is capable of storing). As noted, the page size of the volatile memory 204 may be different than (e.g., larger than) the page size of the non-volatile memory 206.

The interface controller 202 may include various circuits for interfacing (e.g., communicating) with other devices, such as a host device, the volatile memory 204, and the non-volatile memory 206. For example, the interface controller 202 may include a data (DA) bus interface 208, a command and address (C/A) bus interface 210, a data bus interface 212, a C/A bus interface 214, a data bus interface 216, and a C/A bus interface 264. The data bus interfaces may support the communication of information using one or more communication protocols. For example, the data bus interface 208, the C/A bus interface 210, the data bus interface 216, and the C/A bus interface 264 may support information that is communicated using a first protocol (e.g., LPDDR signaling), whereas the data bus interface 212 and the C/A bus interface 214 may support information communicated using a second protocol. Thus, the various bus interfaces coupled with the interface controller 202 may support different amounts of data or data rates.

The data bus interface 208 may be coupled with the data bus 260, the transactional bus 222, and the buffer circuitry 224. The data bus interface 208 may be configured to transmit and receive data over the data bus 260 and control information (e.g., acknowledgements/negative acknowledgements) or metadata over the transactional bus 222. The data bus interface 208 may also be configured to transfer data between the data bus 260 and the buffer circuitry 224. The data bus 260 and the transactional bus 222 may be coupled with the interface controller 202 and the host device such that a conductive path is established between the interface controller 202 and the host device. In some examples, the pins of the transactional bus 222 may be referred to as data mask inversion (DMI) pins. Although shown with one data bus 260 and one transactional bus 222, there may be any number of data buses 260 and any number of transactional buses 222 coupled with one or more data bus interfaces 208.

The C/A bus interface 210 may be coupled with the C/A bus 226 and the decoder 228. The C/A bus interface 210 may be configured to transmit and receive commands and addresses over the C/A bus 226. The commands and addresses received over the C/A bus 226 may be associated with data received or transmitted over the data bus 260. The C/A bus interface 210 may also be configured to transmit commands and addresses to the decoder 228 so that the decoder 228 can decode the commands and relay the decoded commands and associated addresses to the command circuitry 230.

The data bus interface 212 may be coupled with the data bus 232 and the memory interface circuitry 234. The data bus interface 212 may be configured to transmit and receive data over the data bus 232, which may be coupled with the non-volatile memory 206. The data bus interface 212 may also be configured to transfer data between the data bus 232 and the memory interface circuitry 234. The C/A bus interface 214 may be coupled with the C/A bus 236 and the memory interface circuitry 234. The C/A bus interface 214 may be configured to receive commands and addresses from the memory interface circuitry 234 and relay the commands and the addresses to the non-volatile memory 206 (e.g., to a local controller of the non-volatile memory 206) over the C/A bus 236. The commands and the addresses transmitted over the C/A bus 236 may be associated with data received or transmitted over the data bus 232. The data bus 232 and the C/A bus 236 may be coupled with the interface controller 202 and the non-volatile memory 206 such that conductive paths are established between the interface controller 202 and the non-volatile memory 206.

The data bus interface 216 may be coupled with the data buses 238 and the memory interface circuitry 240. The data bus interface 216 may be configured to transmit and receive data over the data buses 238, which may be coupled with the volatile memory 204. The data bus interface 216 may also be configured to transfer data between the data buses 238 and the memory interface circuitry 240. The C/A bus interface 264 may be coupled with the C/A bus 242 and the memory interface circuitry 240. The C/A bus interface 264 may be configured to receive commands and addresses from the memory interface circuitry 240 and relay the commands and the addresses to the volatile memory 204 (e.g., to a local controller of the volatile memory 204) over the C/A bus 242. The commands and addresses transmitted over the C/A bus 242 may be associated with data received or transmitted over the data buses 238. The data bus 238 and the C/A bus 242 may be coupled with the interface controller 202 and the volatile memory 204 such that conductive paths are established between the interface controller 202 and the volatile memory 204.

In addition to buses and bus interfaces for communicating with coupled devices, the interface controller 202 may include circuitry for operating the non-volatile memory 206 as a main memory and the volatile memory 204 as a cache. For example, the interface controller 202 may include command circuitry 230, buffer circuitry 224, cache management circuitry 244, one or more engines 246, and one or more schedulers 248.

The command circuitry 230 may be coupled with the buffer circuitry 224, the decoder 228, the cache management circuitry 244, and the schedulers 248, among other components. The command circuitry 230 may be configured to receive command and address information from the decoder 228 and store the command and address information in the queue 250. The command circuitry 230 may include logic 262 that processes command information (e.g., from a host device) and storage information from other components (e.g., the cache management circuitry 244, the buffer circuitry 224) and uses that information to generate one or more commands for the schedulers 248. The command circuitry 230 may also be configured to transfer address information (e.g., address bits) to the cache management circuitry 244. In some examples, the logic 26 2522 may be a circuit configured to operate as a finite state machine (FSM).

The buffer circuitry 224 may be coupled with the data bus interface 208, the command circuitry 230, the memory interface circuitry 234, and the memory interface circuitry 234. The buffer circuitry 224 may include a set of one or more buffer circuits for at least some banks, if not each bank, of the volatile memory 204. The buffer circuitry 224 may also include components (e.g., a memory controller) for accessing the buffer circuits. In one example, the volatile memory 204 may include sixteen banks and the buffer circuitry 224 may include sixteen sets of buffer circuits. Each set of the buffer circuits may be configured to store data from or for (or both) a respective bank of the volatile memory 204. As an example, the buffer circuit set for bank 0 (BK0) may be configured to store data from or for (or both) the first bank of the volatile memory 204 and the buffer circuit for bank 15 (BK15) may be configured to store data from or for (or both) the sixteenth bank of the volatile memory 204.

Each set of buffer circuits in the buffer circuitry 224 may include a pair of buffers. The pair of buffers may include one buffer (e.g., an open page data (OPD) buffer) configured to store data targeted by an access command (e.g., a write command or read command) from the host device and another buffer (e.g., a victim page data (VPD) buffer) configured to store data for an eviction process that results from the access command. For example, the buffer circuit set for BK0 may include the buffer 218 and the buffer 220, which may be examples of buffer 135-a and 135-b, respectively. The buffer 218 may be configured to store BK0 data that is targeted by an access command from the host device. And the buffer 220 may be configured to store data that is transferred from BK0 as part of an eviction process triggered by the access command. Each buffer in a buffer circuit set may be configured with a size (e.g., storage capacity) that corresponds to a page size of the volatile memory 204. For example, if the page size of the volatile memory 204 is 2 kB, the size of each buffer may be 2 kB. Thus, the size of the buffer may be equivalent to the page size of the volatile memory 204 in some examples.

The cache management circuitry 244 may be coupled with the command circuitry 230, the engines 246, and the schedulers 248, among other components. The cache management circuitry 244 may include a cache management circuit set for one or more banks (e.g., each bank) of volatile memory. As an example, the cache management circuitry 244 may include sixteen cache management circuit sets for BK0 through BK15. Each cache management circuit set may include two memory arrays that may be configured to store storage information for the volatile memory 204. As an example, the cache management circuit set for BK0 may include a memory array 252 (e.g., a Cache DRAM Tag Array (CDT-TA)) and a memory array 254 (e.g., a CDRAM Valid (CDT-V) array), which may be configured to store storage information for BK0. The memory arrays may also be referred to as arrays or buffers in some examples. In some cases, the memory arrays may be or include volatile memory cells, such as static RAM (SRAM) cells.

Storage information (or "metadata") may include content information, validity information, or dirty information (or any combination thereof) associated with the volatile memory 204, among other examples. Content information (which may also be referred to as tag information or address information) may indicate which data is stored in a set of volatile memory cells. For example, the content information (e.g., a tag address) for a row of the volatile memory 204 may indicate which set of one or more non-volatile memory cells currently has data stored in the row. As noted, validity information may indicate whether the data stored in a set of volatile memory cells is actual data (e.g., data having an intended order or form) or placeholder data (e.g., data being random or dummy, not having an intended or important order). And dirty information may indicate whether the data stored in a set of one or more volatile memory cells of the volatile memory 204 is different than corresponding data stored in a set of one or more non-volatile memory cells of the non-volatile memory 206. For example, dirty information may indicate whether data stored in a set of volatile memory cells has been updated relative to data stored in the non-volatile memory 206.

The memory array 252 may include memory cells that store storage information (e.g., tag information, validity information, dirty information) for an associated bank (e.g., BK0) of the volatile memory 204. The storage information may be stored on a per-row basis (e.g., there may be respective storage information for each row of the associated non-volatile memory bank). The interface controller 202 may check for requested data in the volatile memory 204 by referencing the storage information in the memory array 252. For instance, the interface controller 202 may receive, from a host device, a retrieval command for data in a set of non-volatile memory cells in the non-volatile memory 206. The interface controller 202 may use a set of one or more address bits (e.g., a set of row address bits) targeted by the access request to reference the storage information in the memory array 252. For instance, using set-associative mapping, the interface controller 202 may reference the content information in the memory array 252 to determine which set of volatile memory cells, if any, stores the requested data.

In addition to storing content information for volatile memory cells, the memory array 252 may also store validity information that indicates whether the data in a set of volatile memory cells is actual data (also referred to as valid data) or random data (also referred to as invalid data). For example, the volatile memory cells in the volatile memory 204 may initially store random data and continue to do so until the volatile memory cells are written with data from a host device or the non-volatile memory 206. To track which data is valid, the memory array 252 may be configured to set a bit for each set (e.g., row) of volatile memory cells if actual data is stored in that set of volatile memory cells. This bit may be referred to a validity bit or a validity flag. As with the content information, the validity information stored in the memory array 252 may be stored on a per-row basis. Thus, each validity bit may indicate the validity of data stored in an associated row in some examples.

In some examples, the memory array 252 may store dirty information that indicates whether a set (e.g., row) of volatile memory cells stores any dirty data. Like the validity information, the dirty information stored in the memory array 252 may be stored on a per-row basis.

The memory array 254 may be similar to the memory array 252 and may also include memory cells that store storage information for a bank (e.g., BK0) of the volatile memory 204 that is associated with the memory array 252. For example, the memory array 254 may store validity information and dirty information for a bank of the volatile memory 204. However, the storage information stored in the memory array 254 may be stored on a sub-block basis as opposed to a per-row basis. For example, the validity information stored in the memory cells of the memory array 254 may indicate the validity of data for subsets of volatile memory cells in a row of the volatile memory 204.

As an example, the validity information in the memory array 254 may indicate the validity of each subset (e.g., 32 B or 64 B) of data stored in row of BK0 of the volatile memory 204. Similarly, the dirty information stored in the memory cells of the memory array 254 may indicate which subsets of volatile memory cells in a row of the volatile memory 204 store dirty data. For instance, the dirty information in the memory array 254 may indicate the dirty status of each subset (e.g., 32 B or 64 B) of data stored in row of BK0 of the volatile memory 204. Storing storage information (e.g., tag information, validity information) on a per-row basis in the memory array 252 may allow the interface controller 202 to determine whether there is a hit or miss for data in the volatile memory 204. Storing storage information (e.g., validity information, dirty information) on a sub-block basis in the memory array 254 may allow the interface controller 202 to determine which subsets of data to return to the host device (e.g., during a retrieval process) and which subsets of data to preserve in the non-volatile memory 206 (e.g., during an eviction process).

Each cache management circuit set may also include a respective pair of registers coupled with the command circuitry 230, the engines 246, the memory interface circuitry 234, the memory interface circuitry 240, and the memory arrays for that cache management circuit set, among other components. For example, a cache management circuit set may include a first register (e.g., a register 256 which may be an open page tag (OPT) register) configured to receive storage information (e.g., one or more bits of tag information, validity information, or dirty information, other information, or any combination) from the memory array 252 or the scheduler 248-b or both. The cache management circuitry set may also include a second register (e.g., a register 258 which may be a victim page tag (VPT) register) configured to receive storage information (e.g., validity information or dirty information or both) from the memory array 254 and the scheduler 248-a or both. The information in the register 256 and the register 258 may be transferred to the command circuitry 230 and the engines 246 to enable decision-making by these components. For example, the command circuitry 230 may issue commands for reading the non-volatile memory 206 or the volatile memory 204 based on or in response to storage information in the register 256, or the register 258, or both.

The engine 246-a may be coupled with the register 256, the register 258, and the schedulers 248. The engine 246-a may be configured to receive storage information from various components and issue commands to the schedulers 248 based on the storage information. For example, if the interface controller 202 is in a first mode such as a write-through mode, the engine 246-a may issue commands to the scheduler 248-b and in response the scheduler 248-b to initiate or facilitate the transfer of data from the buffer 218 to both the volatile memory 204 and the non-volatile memory 206. Alternatively, if the interface controller 202 is in a second mode such as a write-back mode, the engine 246-a may issue commands to the scheduler 248-b and in response the scheduler 248-b may initiate or facilitate the transfer of data from the buffer 218 to the volatile memory 204. In the event of a write-back operation, the data stored in the volatile memory 204 may eventually be transferred to the non-volatile memory 206 during a subsequent eviction process.

The engine 246-b may be coupled with the register 258 and the scheduler 248-a. The engine 246-b may be configured to receive storage information from the register 258 and issue commands to the scheduler 248-a based on the storage information. For instance, the engine 246-b may issue commands to the scheduler 248-a to initiate or facilitate transfer of dirty data from the buffer 220 to the non-volatile memory 206 (e.g., as part of an eviction process). If the buffer 220 holds a set of data transferred from the volatile memory 204 (e.g., victim data), the engine 246-b may indicate which one or more subsets (e.g., which 64B) of the set of data in the buffer 220 should be transferred to the non-volatile memory 206.

The scheduler 248-a may be coupled with various components of the interface controller 202 and may facilitate accessing the non-volatile memory 206 by issuing commands to the memory interface circuitry 234. The commands issued by the scheduler 248-a may be based on or in response to commands from the command circuitry 230, the engine 246-a, the engine 246-b, or a combination of these components. Similarly, the scheduler 248-b may be coupled with various components of the interface controller 202 and may facilitate accessing the volatile memory 204 by issuing commands to the memory interface circuitry 240. The commands issued by the scheduler 248-b may be based on or in response to commands from the command circuitry 230 or the engine 246-a, or both.

The memory interface circuitry 234 may communicate with the non-volatile memory 206 via one or more of the data bus interface 212 and the C/A bus interface 214. For example, the memory interface circuitry 234 may prompt the C/A bus interface 214 to relay commands issued by the memory interface circuitry 234 over the C/A bus 236 to a local controller in the non-volatile memory 206. And the memory interface circuitry 234 may transmit to, or receive data from, the non-volatile memory 206 over the data bus 232. In some examples, the commands issued by the memory interface circuitry 234 may be supported by the non-volatile memory 206 but not the volatile memory 204 (e.g., the commands issued by the memory interface circuitry 234 may be different than the commands issued by the memory interface circuitry 240).

The memory interface circuitry 240 may communicate with the volatile memory 204 via one or more of the data bus interface 216 and the C/A bus interface 264. For example, the memory interface circuitry 240 may prompt the C/A bus interface 264 to relay commands issued by the memory interface circuitry 240 over the C/A bus 242 to a local controller of the volatile memory 204. And the memory interface circuitry 240 may transmit to, or receive data from, the volatile memory 204 over one or more data buses 238. In some examples, the commands issued by the memory interface circuitry 240 may be supported by the volatile memory 204 but not the non-volatile memory 206 (e.g., the commands issued by the memory interface circuitry 240 may be different than the commands issued by the memory interface circuitry 234).

Together, the components of the interface controller 202 may operate the non-volatile memory 206 as a main memory and the volatile memory 204 as a cache. Such operation may be prompted by one or more access commands (e.g., read/retrieval commands/requests and write/storage commands/requests) received from a host device.

In some examples, the interface controller 202 may receive a storage command from the host device. The storage command may be received over the C/A bus 226 and transferred to the command circuitry 230 via one or more of the C/A bus interface 210 and the decoder 228. The storage command may include or be accompanied by address bits that target a memory address of the non-volatile memory 206. The data to be stored may be received over the data bus 260 and transferred to the buffer 218 via the data bus interface 208. In a write-through mode, the interface controller 202 may transfer the data to both the non-volatile memory 206 and the volatile memory 204. In a write-back mode, the interface controller 202 may transfer the data to only the volatile memory 204.

In either mode, the interface controller 202 may first check to see if the volatile memory 204 has memory cells available to store the data. To do so, the command circuitry 230 may reference the memory array 252 (e.g., using a set of the memory address bits) to determine whether one or more of the n sets (e.g., row) of volatile memory cells associated with the memory address are empty (e.g., store random or invalid data). For example, the command circuitry 230 may determine whether one or more of the n sets (e.g., rows) of volatile memory cells is available based on tag information and validity information stored in the memory array 252. In some cases, a set of volatile memory cells in the volatile memory 204 may be referred to as a line, cache line, or row.

If one of then associated sets of volatile memory cells is available for storing information, the interface controller 202 may transfer the data from the buffer 218 to the volatile memory 204 for storage in that set of volatile memory cells. But if no associated sets of volatile memory cells are empty, the interface controller 202 may initiate an eviction process to make room for the data in the volatile memory 204. The eviction process may involve transferring the victim data from one of the n associated sets of volatile memory cells to the buffer 220. The dirty information for the victim data may be transferred from the memory array 254 to the register 258 for identification of dirty subsets of the victim data. After the victim data is stored in the buffer 220, the new data can be transferred from the buffer 218 to the volatile memory 204 and the victim data can be transferred from the buffer 220 to the non-volatile memory 206. In some cases, dirty subsets of the old data are transferred to the non-volatile memory 206 and clean subsets (e.g., unmodified subsets) are discarded. The dirty subsets may be identified by the engine 246-b based on or in response to dirty information transferred from the memory array 254 to the register 258 during the eviction process.

In another example, the interface controller 202 may receive a retrieval command from the host device. The retrieval command may be received over the C/A bus 226 and transferred to the command circuitry 230 via one or more of the C/A bus interface 210 and the decoder 228. The retrieval command may include address bits that target a memory address of the non-volatile memory 206. Before attempting to access the targeted memory address of the non-volatile memory 206, the interface controller 202 may check to see if the volatile memory 204 stores the data. To do so, the command circuitry 230 may reference the memory array 252 (e.g., using a set of the memory address bits) to determine whether one or more of the n sets (e.g., rows) of volatile memory cells associated with the memory address stores the requested data. If the requested data is stored in the volatile memory 204, the interface controller 202 may transfer the requested data to the buffer 218 for transmission to the host device over the data bus 260.

If the requested data is not stored in the volatile memory 204, the interface controller 202 may retrieve the data from the non-volatile memory 206 and transfer the data to the buffer 218 for transmission to the host device over the data bus 260. Additionally, the interface controller 202 may transfer the requested data from the buffer 218 to the volatile memory 204 so that the data can be accessed with a lower latency during a subsequent retrieval operation. Before transferring the requested data, however, the interface controller 202 may first determine whether one or more of the n associated sets of volatile memory cells is available to store the requested data. The interface controller 202 may determine the availability of the n associated sets of volatile memory cells by communicating with the related cache management circuit set. If an associated set of volatile memory cells is available, the interface controller 202 may transfer the data in the buffer 218 to the volatile memory 204 without performing an eviction process. Otherwise, the interface controller 202 may transfer the data from the buffer 218 to the volatile memory 204 after performing an eviction process.

The memory subsystem 200 may be implemented in one or more configurations, including one-chip versions and multi-chip versions. A multi-chip version may include one or more constituents of the memory subsystem 200, including the interface controller 202, the volatile memory 204, and the non-volatile memory 206 (among other constituents or combinations of constituents), on a chip that is separate from a chip that includes one or more other constituents of the memory subsystem 200. For example, in one multi-chip version, respective separate chips may include each of the interface controller 202, the volatile memory 204, and the non-volatile memory 206. In contrast, a one-chip version may include the interface controller 202, the volatile memory 204, and the non-volatile memory 206 on a single chip.

As noted, the volatile memory 204 may include multiple banks (e.g., to keep overhead, such as storage information, at a manageable level) and each bank may have an associated ECC circuit to compensate for slow ECC operations (e.g., due to slow processes associated with the memory die of the volatile memory 204). Similarly, the non-volatile memory 206 may include multiple banks and each bank may have an associated ECC circuit. But including per-bank ECC circuits on the memory dies for the volatile memory 204 and the non-volatile memory 206 reduces the capacities of the volatile memory 204 and the non-volatile memory 206. According to the techniques described herein, the capacities of the volatile memory 204 and the non-volatile memory 206 may be increased (or the physical sizes of the volatile memory 204 and the non-volatile memory 206 may be decreased) by using a first ECC logic for the volatile memory 204 on the interface controller 202 and a second ECC logic for the non-volatile memory 206 on the interface controller 202, as one example.

Although described with reference to respective centralized ECC circuits for the volatile memory 204 and the non-volatile memory 206, a single centralized ECC circuit is also alternatively contemplated. The single centralized ECC circuit may serve one or both of the volatile memory 204 or the non-volatile memory 206. If the single centralized ECC circuit serves the volatile memory 204, the non-volatile memory 206 may have per-bank ECC circuits on the memory die of the non-volatile memory 206. If the single centralized ECC circuit serves the non-volatile memory 206, the volatile memory 204 may have per-bank ECC circuits on the memory die of the volatile memory 204.

Figure 3:
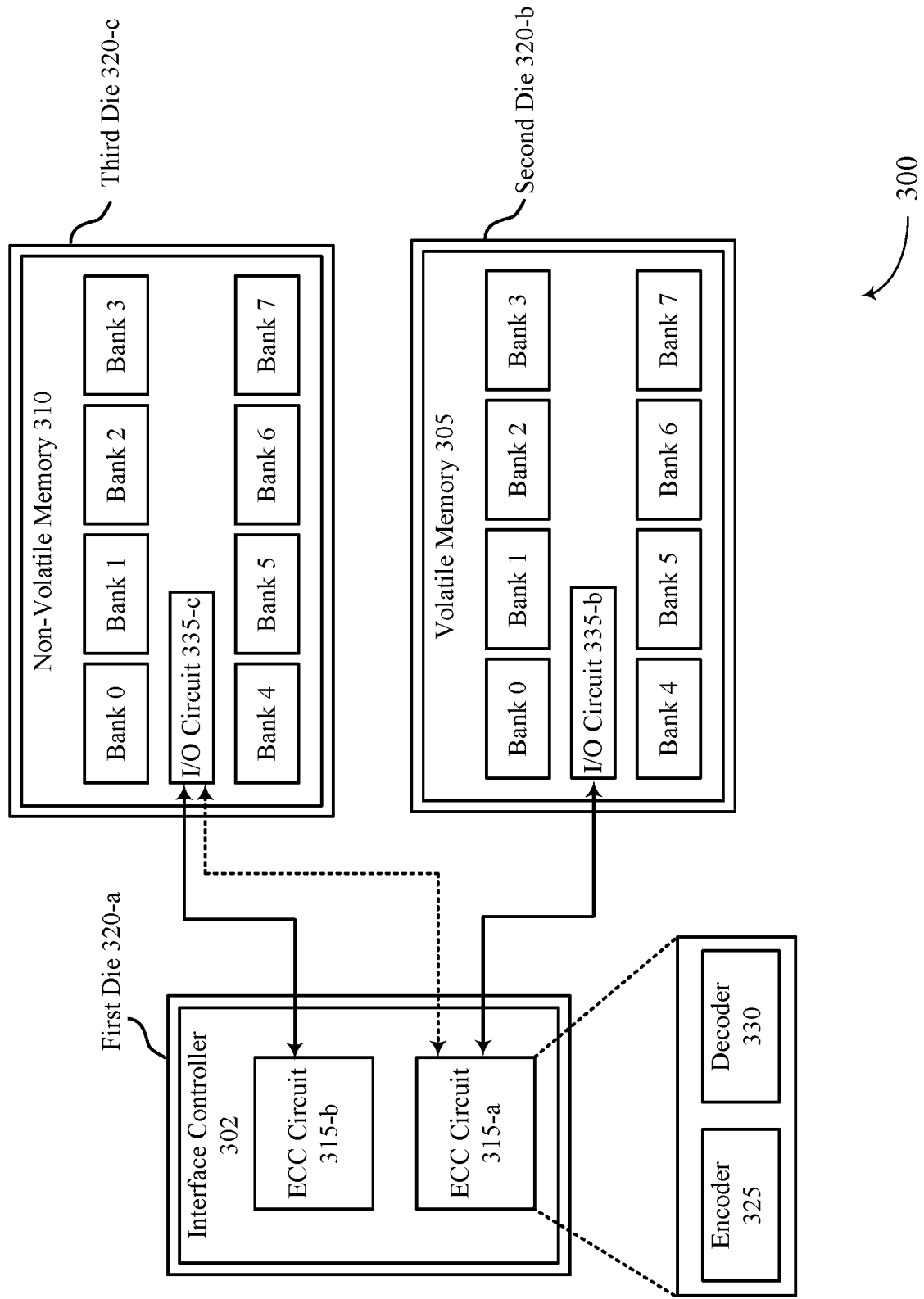
FIG. 3 illustrates an example of a device that supports centralized error correction circuit in accordance with examples as disclosed herein.

FIG. 3 illustrates an example of a device 300 that supports centralized error correction circuit in accordance with examples as disclosed herein. The device 300 may be an example of the memory subsystem 110 as described with reference to FIG. 1 or the memory subsystem 200 as described with reference to FIG. 2. The device may include an interface controller 302, a volatile memory 305, and a non-volatile memory 310, which may be coupled with one another via one or more transmission lines, buses, or both. As described herein, device 300 may use a centralized ECC circuit 315 for the volatile memory 305, the non-volatile memory 310, or both.

Although included in a same physical package, the interface controller 302, the volatile memory 305, and the non-volatile memory 310 may be disposed on two or more different dies. For example, the interface controller 302 may be disposed on a first die 320-a, the volatile memory may be disposed on a second die 320-b, and the non-volatile memory 310 may be disposed on a third die 320-c. The first die 320-a may be manufactured with advanced techniques that are unsupported by (or incompatible with) the other dies and that result in faster processes associated with the interface controller 302. Thus, an ECC circuit disposed on the first die 320-a, such the ECC circuit 315-a included in the interface controller 302, may be faster compared to ECC circuits was disposed on memory dies (such as the second die 320-b or the third die 320-c). Although shown disposed on different dies, in some examples the volatile memory 305 and the non-volatile memory 310 may be disposed on a same die.

The volatile memory 305 may include multiple banks denoted Bank 0 through Bank 7 as well as supporting controllers and circuitry, such as I/O circuit. Rather than use per-bank ECC circuits on the second die 320-b for error correction, the volatile memory 305 may offload error correction operations to a centralized ECC circuit on the first die 320-a, such as ECC circuit 315-a. Although shown with eight banks, other quantities of banks are contemplated for the volatile memory 305.

The non-volatile memory 310 may include multiple banks denoted Bank 0 through Bank 7. Rather than use eight ECC circuits on the third die 320-c for error correction operations for the banks (e.g., one ECC circuit per bank), the non-volatile memory 310 may offload its error correction operations to a centralized ECC circuit on the first die 320-a, such as ECC circuit 315-b. Although shown with eight banks, other quantities of banks are contemplated for the non-volatile memory 310.

At a high level, the ECC circuit 315-a may perform encoding operations and decoding operations for the volatile memory 305. For example, the ECC circuit 315-a may encode data bits from a host device to generate a codeword for storage in a bank of the volatile memory 305. After the ECC circuit 315-a generates a codeword, the interface controller 302 may communicate the codeword to the volatile memory 305, for example, for storage. If data stored in the volatile memory 305 is requested by the host device, the ECC circuit 315-a may receive the codeword that includes the data from the volatile memory 305 and decode the codeword to detect any errors. After the ECC circuit 315-a corrects any detected errors in the data, the interface controller 302 may communicate the data to the host device.

So, the ECC circuit 315-a may allow the interface controller 302 to detect and correct errors (e.g., one bit errors, two bits errors) in data stored by the volatile memory 305. Specifically, the ECC circuit 315-a may encode (e.g., generate) codewords for storage in the volatile memory 305 and decode codewords from the volatile memory 305. For example, the ECC circuit 315-a may use encoder 325 to generate parity bits that, if combined with data bits, form a codeword that can be used by the memory subsystem 110 to detect errors in the codeword. The parity bits may be generated by applying an error correction code to the data bits, which may include transferring the data bits through a logic circuit made up of, for example, a series of XOR logic gates. After the ECC circuit 315-a generates a codeword, the interface controller 302 may communicate the codeword to the volatile memory 305 for storage in the appropriate bank. Encoded codewords may be communicated from the interface controller 302 to the volatile memory 305, for example, via the I/O circuit 335-b.

If data bits stored in the volatile memory 305 are requested by the host device, the volatile memory 305 may read the codeword that includes the data bits and communicate that codeword to the interface controller 302. Thus, an uncorrected codeword may be communicated to the interface controller 302, for example, via the I/O circuit 335-b. The ECC circuit 315-a may use the decoder 330 to decode the codeword by performing a series of logical operations of the codeword to detect any errors in the codeword. If the decoder 330 detects one or more errors in the data bits of the codeword, the decoder 330 (or additional circuitry in the ECC circuit 315-a, or some combination of both) may correct the errors before communicating the data bits to the host device. Thus, the ECC circuit 315-a may detect and correct errors in data from the volatile memory 305 before returning the data to the host device.

In some examples, the ECC circuit 315-a may additionally or alternatively serve the non-volatile memory 310. For example, the ECC circuit 315-a may encode data for the non-volatile memory 310 and decode data from the non-volatile memory 310 (similar to how the ECC circuit 315-a may encode data for the volatile memory 305 and decode data from the volatile memory 305). However, using the same centralized ECC circuit for the volatile memory 305 and the non-volatile memory 310 may be relatively more complex if different error correction codes are used for the two memories, among other reasons. So, alternatively, the non-volatile memory 310 may be served by the ECC circuit 315-*b*. For example, the ECC circuit 315-*b* may encode data for the non-volatile memory 310 and decode data from the non-volatile memory 310. Thus, the ECC circuit 315-*b* may operate similar to the ECC circuit 315-*a* and may include an encoder for encoding and a decoder for decoding. Encoding and decoding may be referred to generally as ECC operations. An encoder may also be referred to as an encoder circuit, encoder circuitry, encoder logic, or other suitable terminology. A decoder may also be referred to as a decoder circuit, decoder circuitry, decoder logic, or other suitable terminology.

Thus, error correction operations for the volatile memory 305 and the non-volatile memory 310 may be offloaded to ECC circuits 315 on the first die 320-*a*, which may, relative to other configurations, increase the space on the second die 320-*b*, the third die 320-*c*, or both for memory cells, among other advantages.

Figure 4:
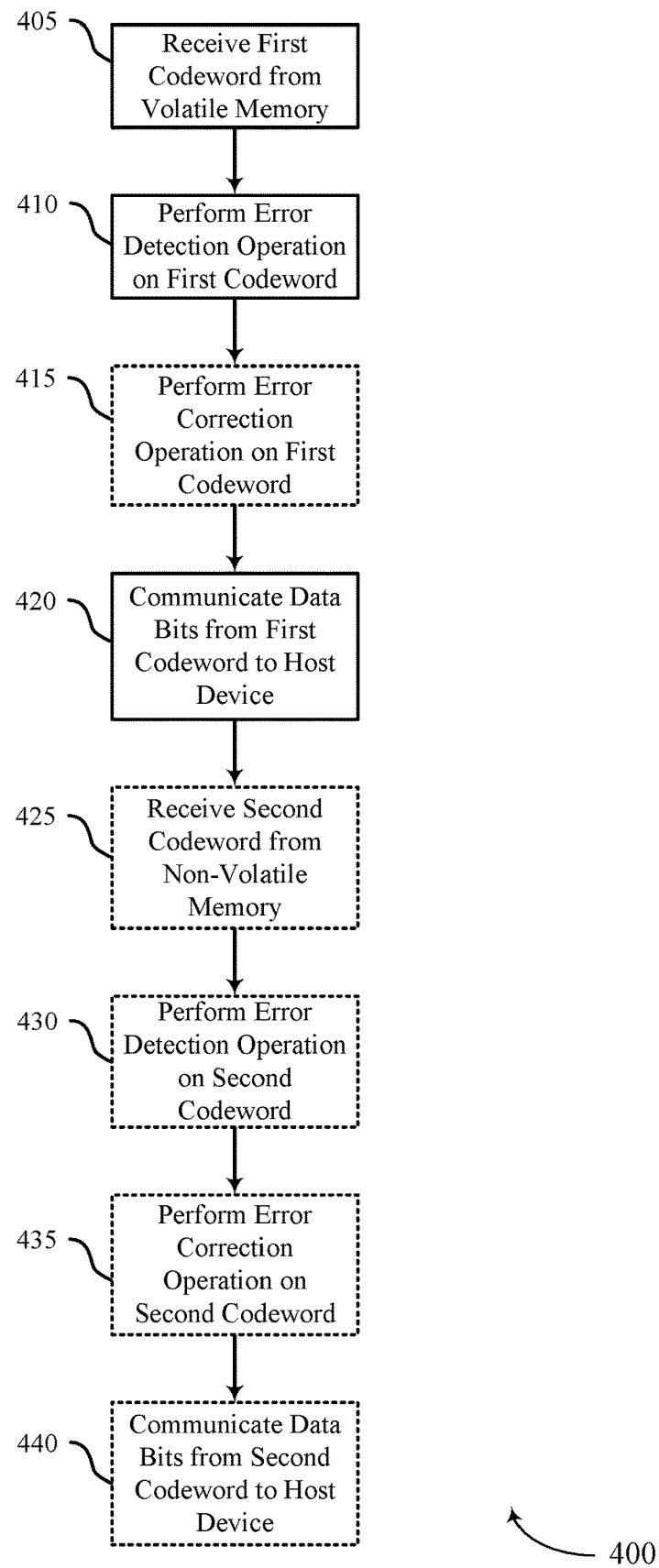
FIG. 4 illustrates an example of a process flow that supports centralized error correction circuit in accordance with examples as disclosed herein.

FIG. 4 illustrates an example of a process flow 400 that supports centralized error correction circuit in accordance with examples as disclosed herein. Process flow 400 may be implemented by a memory subsystem 110 or interface controller 115 as described with reference to FIG. 1, a memory subsystem 200 or interface controller 202 as described with reference to FIG. 2, or a device 300 or interface controller 302 as described with reference to FIG. 3, or any combination thereof. However, other types of devices may implement the process flow 400. The process flow 400 may illustrate the operations of a device that uses one or more centralized ECC circuits for ECC operations of a volatile memory and a non-volatile memory.

For ease of reference, the process flow 400 is described with reference to a device. For example, aspects of the process flow 400 may be implemented by a device that includes an interface controller, a volatile memory, and a non-volatile memory disposed on two or more different dies. Additionally or alternatively, aspects of the process flow 400 may be implemented as instructions stored in memory (e.g., firmware stored in the volatile memory 120 or the non-volatile memory 125 or both). For example, the instructions, if executed by a controller, may cause the controller to perform the operations of the process flow 400.

At 405, a first codeword may be received, for example, from the volatile memory. For example, the interface controller 302 may receive the first codeword from the volatile memory 305 via the I/O circuit 335-*b*. The first codeword may be read from memory cells in any of the banks B0 through B7 and may include data bits and parity bits that were generated based on the data bits. The data bits may be data bits requested by a host device or data bits involved in an eviction procedure, among other examples.

At 410, an error detection operation may be performed on the first codeword. For example, the ECC circuit 315-*a* may, via the decoder 330, decode the first codeword to detect any errors in the first codeword. At 415, an error correction operation may be performed. For example, the ECC circuit 315-*a* may, via the decoder 330 or other circuitry, correct one or more errors detected in the first codeword. Correcting an error may refer to inverting the bit(s) of the codeword that are in error. In some examples, the ECC circuit 315-*a* may be configured to correct errors in the data bits of codewords, but not errors in parity bits of the codewords (e.g., because the data bits may be returned to the host device whereas the parity bits may not be returned to the host device). If no errors are detected at 410, the ECC circuit 315-*a* may skip the error correction operations at 415.

At 420, the data bits of the first codeword may be communicated, for example, to the host device. For example, the interface controller 302 may communicate the data bits of the first codeword to the host device. Additionally or alternatively, the data bits may be communicated to the non-volatile memory 310 (e.g., as part of an eviction procedure to clear some space in the volatile memory 305).

At 425, a second codeword may be received, for example, from the non-volatile memory. For example, the interface controller 302 may receive the second codeword from the non-volatile memory 310 via the I/O circuit 335-*c*. The second codeword may be read from memory cells in any of the banks B0 through B7 of the non-volatile memory 310 and may include data bits and parity bits that were generated based on the data bits. The data bits may be data bits requested by the host device or data bits involved in a fill procedure (e.g., a procedure that occurs if there is a read miss and in which data from the non-volatile memory 310 is stored in the volatile memory 305).

At 430, an error detection operation may be performed on the second codeword. For example, the ECC circuit 315-*b* may, via a decoder, decode the second codeword to detect any errors in the second codeword. At 435, an error correction operation may be performed. For example, the ECC circuit 315-*b* may, via a decoder or other circuitry, correct one or more errors detected in the second codeword. In some examples, the ECC circuit 315-*b* may be configured to correct errors in the data bits of codewords but not errors in parity bits of the codewords (e.g., because the data bits may be returned to the host device whereas the parity bits may not be returned to the host device). If no errors are detected at 430, the ECC circuit 315-*b* may skip the error correction operations at 435.

At 440, the data bits of the second codeword may be communicated, for example, to the host device. For example, the interface controller 302 may communicate the data bits of the second codeword to the host device. Additionally or alternatively, the data bits may be communicated to the volatile memory 305 (e.g., as part of a fill procedure).

Thus, the device may use one or more centralized ECC circuits for ECC operations of a volatile memory and a non-volatile memory. For example, the device may use a first centralized ECC circuit for the ECC operations of the volatile memory and a second centralized ECC circuit for the ECC operations of the non-volatile memory. In another example, the device may use a single centralized ECC circuit for the ECC operations of both the volatile memory and the non-volatile memory. In another example, the device may use a centralized ECC circuit for ECC operations of one of the memories and may use one or more on-die ECC circuits for ECC operations of the other memory. It should be appreciated that ECC operations performed on the first codeword from the volatile memory may be performed at the same time as (e.g., concurrent with, simultaneous with), or at a different time than, ECC operations performed on the second codeword from the non-volatile memory.

Alternative examples of the foregoing may be implemented, where some operations are performed in a different order than described, are performed in parallel, or are not performed at all. In some cases, operations may include additional features not mentioned below, or further operations may be added. Additionally, certain operations may be performed multiple times or certain combinations of operations may repeat or cycle.

Figure 5:
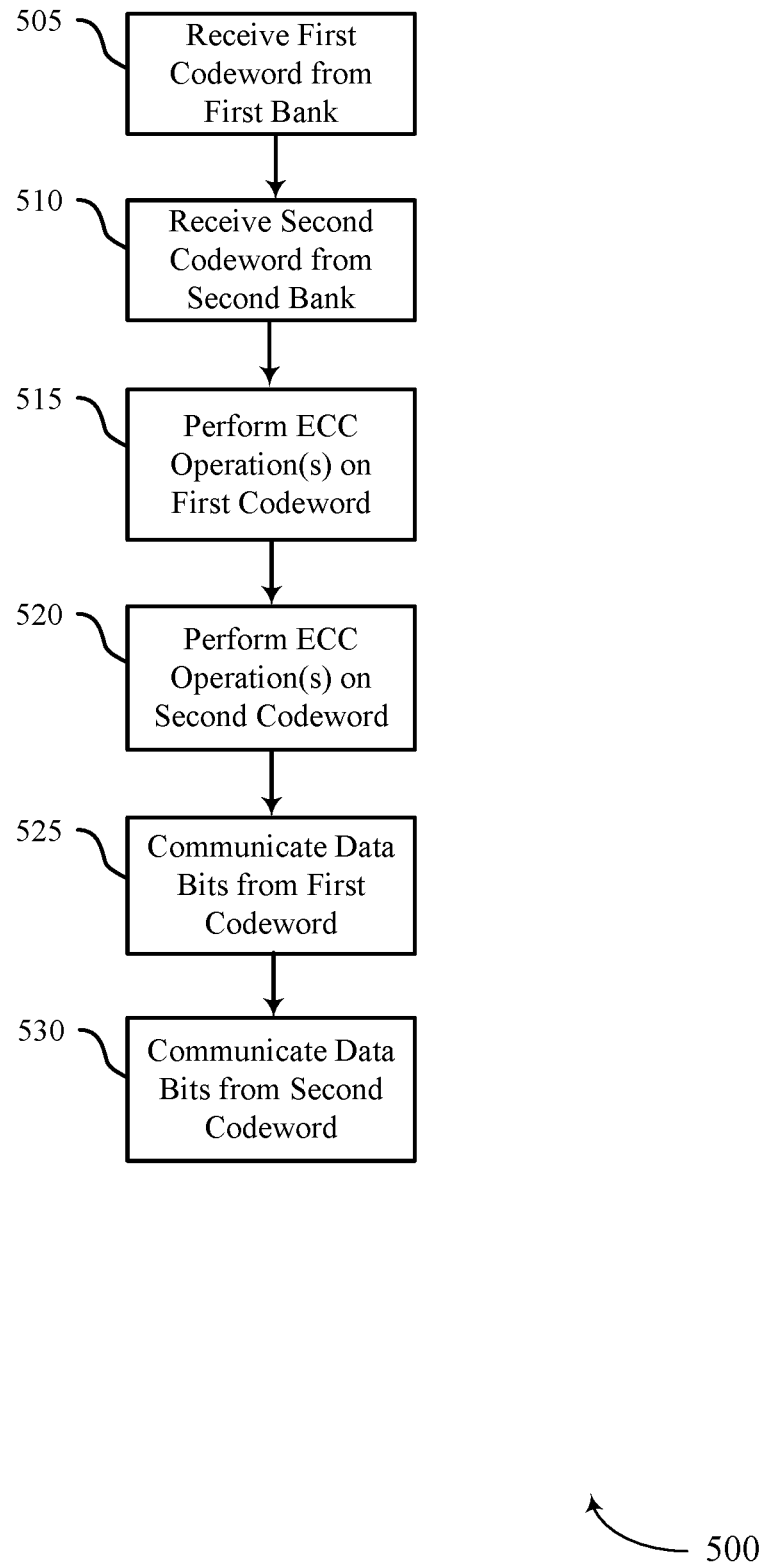
FIG. 5 illustrates an example of a process flow that supports centralized error correction circuit in accordance with examples as disclosed herein.

FIG. 5 illustrates an example of a process flow 500 that supports centralized error correction circuit in accordance with examples as disclosed herein. Process flow 500 may be implemented by a memory subsystem 110 or interface controller 115 as described with reference to FIG. 1, a memory subsystem 200 or interface controller 202 as described with reference to FIG. 2, or a device 300 or interface controller 302 as described with reference to FIG. 3, or any combination thereof. However, other types of devices may implement the process flow 500. The process flow 500 may illustrate the operations of a device that uses a centralized ECC circuit for ECC operations for multiple banks of a volatile memory. Although described with reference to the volatile memory 305, the operations of the process flow 500 may be implemented in a similar manner for the non-volatile memory 310.

For ease of reference, the process flow 500 is described with reference to a device. For example, aspects of the process flow 500 may be implemented by a device that includes an interface controller and a volatile memory disposed on different dies. Additionally or alternatively, aspects of the process flow 500 may be implemented as instructions stored in memory (e.g., firmware stored in the volatile memory 120 or the non-volatile memory 125 or both). For example, the instructions, if executed by a controller, may cause the controller to perform the operations of the process flow 500.

At 505, a first codeword may be received, for example, from a first bank of the volatile memory. For example, the interface controller 302 may receive the first codeword from bank B0 the volatile memory 305 via the I/O circuit 335-b. The first codeword may include a first set of data bits and parity bits that were generated based on the first set of data bits. The first set of data bits may be data bits requested by a host device, or data bits involved in an eviction procedure, or both.

At 510, a second codeword may be received, for example, from a second bank of the volatile memory. For example, the interface controller 302 may receive the second codeword from bank B1 the volatile memory 305 via the I/O circuit 335-b. The second codeword may include a second set of data bits and parity bits that were generated based on the second set of data bits. The second set of data bits may be data bits requested by the host device, or data bits involved in an eviction procedure, or both.

At 515, ECC operations may be performed on the first codeword. For example, the ECC circuit 315-a may perform an error detection procedure on the first codeword (e.g., the decoder 330 may decode the first codeword) and, if one or more errors are detected, perform an error correction procedure on the first codeword. At 520, ECC operations may be performed on the second codeword. For example, the ECC circuit 315-a may perform an error detection procedure on the second codeword (e.g., the decoder 330 may decode the second codeword) and, if one or more errors are detected, perform an error correction procedure on the second codeword. In some examples, the ECC operations at 515 or 520 may be performed in parallel (e.g., concurrently as being at least partially overlapping, or simultaneously as being aligned) or may be performed serially.

At 525, the first set of data bits from the first codeword may be communicated. For example, the interface controller 302 may communicate the first set of data bits to the host device, the non-volatile memory 310 (e.g., as part of an eviction procedure), or both. At 530, the second set of data bits from the second codeword may be communicated. For example, the interface controller 302 may communicate the second set of data bits to the host device, the non-volatile memory 310 (e.g., as part of an eviction procedure), or both.

Thus, the device may use a centralized ECC circuit for ECC operations for multiple banks of the volatile memory.

Alternative examples of the foregoing may be implemented, where some operations are performed in a different order than described, are performed in parallel, or are not performed at all. In some cases, operations may include additional features not mentioned below, or further operations may be added. Additionally, certain operations may be performed multiple times or certain combinations of operations may repeat or cycle.

Figure 6:
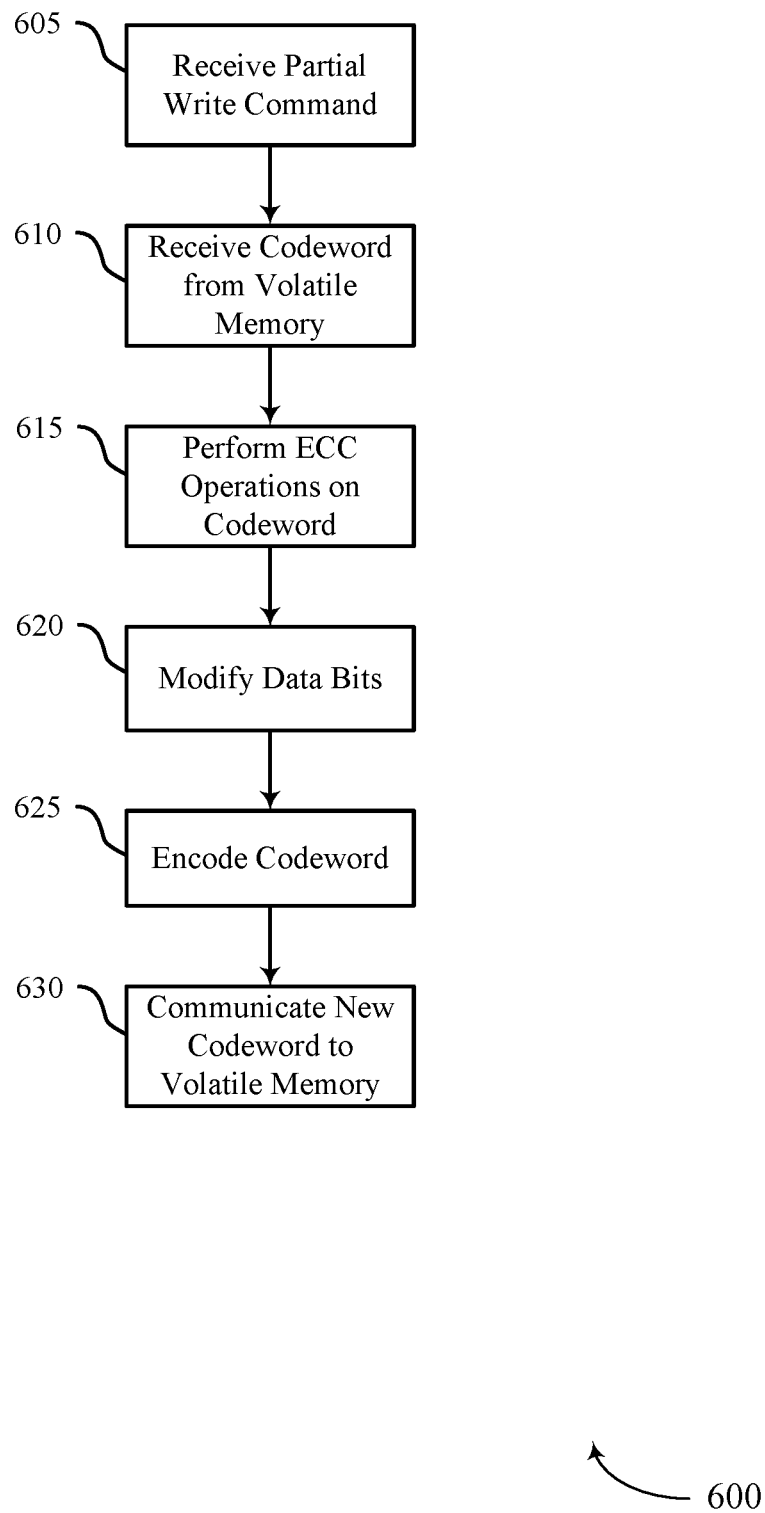
FIG. 6 illustrates an example of a process flow that supports centralized error correction circuit in accordance with examples as disclosed herein.

FIG. 6 illustrates an example of a process flow 600 that supports centralized error correction circuit in accordance with examples as disclosed herein. Process flow 600 may be implemented by a memory subsystem 110 or interface controller 115 as described with reference to FIG. 1, a memory subsystem 200 or interface controller 202 as described with reference to FIG. 2, or a device 300 or interface controller 302 as described with reference to FIG. 3, or any combination thereof. However, other types of devices may implement the process flow 600. The process flow 600 may illustrate the operations of a device that uses a centralized ECC circuit to perform a read-modify-write (RMW) operation on codeword from a volatile memory.

For ease of reference, the process flow 600 is described with reference to a device. For example, aspects of the process flow 600 may be implemented by a device that includes an interface controller and a volatile memory disposed on different dies. Additionally or alternatively, aspects of the process flow 600 may be implemented as instructions stored in memory (e.g., firmware stored in the volatile memory 120 or the non-volatile memory 125 or both). For example, the instructions, when executed by a controller, may cause the controller to perform the operations of the process flow 600.

At 605, command, such as a partial write command may be received. For example, the interface controller 302 may receive a partial write command from a host device. The partial write command may target (e.g., be associated with) a memory address. A partial write command may be a write command that is associated with a set of data that is insufficiently sized (e.g., too small) for accessing the volatile memory 305, which may have a threshold size for access. For example, if the volatile memory 305 have a threshold size of 64 B, a partial write command may be associated with 32 B of data.

At 610, a codeword may be received. For example, the interface controller 302 may receive a codeword associated with the memory address targeted by the partial write command. The codeword may be received from the volatile memory 305 (e.g., after the volatile memory 305 reads the codeword) in response to a request sent by the interface controller 302 to the volatile memory 305.

At 615, ECC operations may be performed on the codeword. For example, the ECC circuit 315-a may perform an error detection procedure on the codeword (e.g., the decoder 330 may decode the first codeword) and, if one or more errors are detected, perform an error correction procedure on the codeword.

At 620, data bits from the codeword may be modified (e.g., by over-writing the data bits with new values based on the data associated with the partial write command). For example, if the codeword included a set of data bits, the interface controller 302 may modify a subset of those data bits (e.g., 32 B out of 64 B) to reflect the data bits associated with the partial write command.

At 625, the set of data bits (including the modified subset of data bits) may be encoded to form a codeword that includes the data bits and parity bits generated based on the set of data bits. Thus, a new codeword may be generated or "encoded." At 630, the new codeword may be communicated to the volatile memory 305 for storage. Thus, the device may perform a read-modify-write operation on a codeword to satisfy a partial write command.

Alternative examples of the foregoing may be implemented, where some operations are performed in a different order than described, are performed in parallel, or are not performed at all. In some cases, operations may include additional features not mentioned below, or further operations may be added. Additionally, certain operations may be performed multiple times or certain combinations of operations may repeat or cycle.

Figure 7:
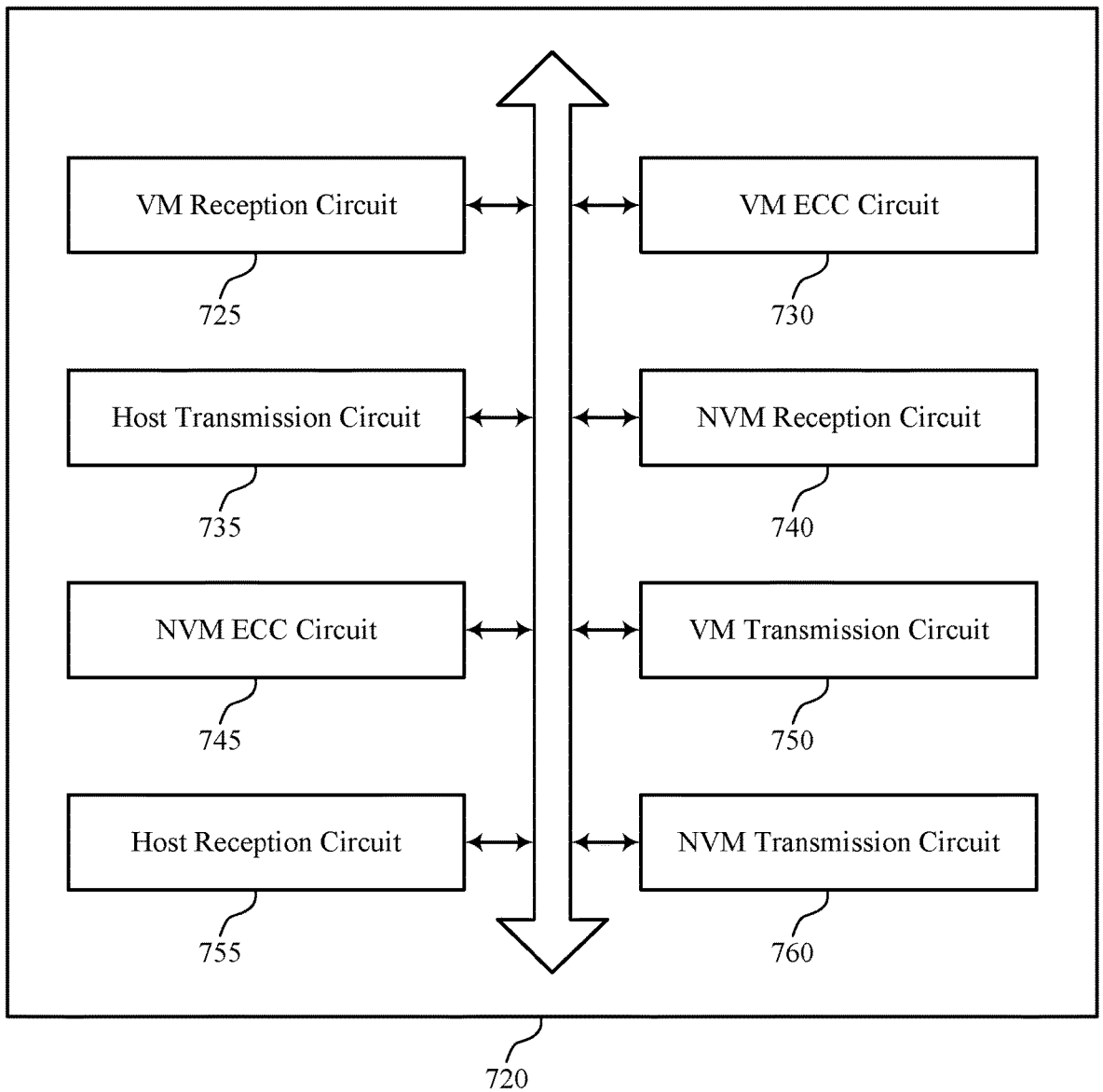
FIG. 7 shows a block diagram of an interface controller that supports centralized error correction circuit in accordance with examples as disclosed herein.

FIG. 7 shows a block diagram 700 of an interface controller 720 that supports centralized error correction circuit in accordance with examples as disclosed herein. The interface controller 720 may be an example of aspects of an interface controller as described with reference to FIGS. 1 through 6. The interface controller 720, or various components thereof, may be an example of means for performing various aspects of centralized error correction circuit as described herein. For example, the interface controller 720 may include a volatile memory (VM) reception circuit 725, a VM ECC circuit 730, a host transmission circuit 735, a non-volatile memory (NVM) reception circuit 740, an NVM ECC circuit 745, a VM transmission circuit 750, a host reception circuit 755, an NVM transmission circuit 760, or any combination thereof. Each of these components may communicate, directly or indirectly, with one another (e.g., via one or more buses).

The reception circuit 725 may be or include a data bus, a data bus interface, logic, circuitry, a processor, a controller, or other components capable of performing the functions described herein. The VM ECC circuit 730 may be or include a combination of logic, circuits, controllers, registers, latches, buffers, or other components capable of performing the functions described herein. The host transmission circuit 735 may be or include a data bus, a data bus interface, logic, circuitry, a processor, a controller, or other components capable of performing the functions described herein. The NVM reception circuit 740 may be or include a data bus, a data bus interface, logic, circuitry, a processor, a controller, or other components capable of performing the functions described herein. The NVM ECC circuit 745 may be or include a combination of logic, circuits, controllers, registers, latches, buffers, or other components capable of performing the functions described herein. The VM transmission circuit 750 may be or include a data bus, a data bus interface, logic, circuitry, a processor, a controller, or other components capable of performing the functions described herein. The host reception circuit 755 may be or include a data bus, a data bus interface, logic, circuitry, a processor, a controller, or other components capable of performing the functions described herein. The NVM transmission circuit 760 may be or include a data bus, a data bus interface, logic, circuitry, a processor, a controller, or other components capable of performing the functions described herein.

The VM reception circuit 725 may be configured as or otherwise support a means for receiving a codeword from a bank of a volatile memory disposed on a first die, the volatile memory operated as a cache for a non-volatile memory. The VM ECC circuit 730 may be configured as or otherwise support a means for performing an error detection operation on the codeword from the bank using an ECC circuit included in an interface controller that is disposed on a second die and that is coupled with the non-volatile memory and the volatile memory. The host transmission circuit 735 may be configured as or otherwise support a means for communicating data bits of the codeword from the interface controller to a host device based at least in part on performing the error detection operation.

In some examples, the VM ECC circuit 730 may be configured as or otherwise support a means for detecting an error in the codeword based at least in part performing the error detection operation. In some examples, the VM ECC circuit 730 may be configured as or otherwise support a means for correcting the error using the ECC circuit before communicating the data bits of the codeword to the host device.

In some examples, the VM ECC circuit 730 may be configured as or otherwise support a means for receiving a second codeword from a second bank of the volatile memory. In some examples, the VM ECC circuit 730 may be configured as or otherwise support a means for performing an error detection operation on the second codeword from the second bank using the ECC circuit included in the interface controller.

In some examples, the codeword includes a set of data bits including the data bits, and the VM ECC circuit 730 may be configured as or otherwise support a means for modifying, by the interface controller, a subset of data bits of the set of data bits after the error detection operation is performed. In some examples, the codeword includes a set of data bits including the data bits, and the VM ECC circuit 730 may be configured as or otherwise support a means for encoding, by the interface controller, the set of data bits after updating the subset of data bits to generate an updated codeword. In some examples, the codeword includes a set of data bits including the data bits, and the VM transmission circuit 750 may be configured as or otherwise support a means for communicating the updated codeword from the interface controller to the volatile memory for storage.

In some examples, the host reception circuit 755 may be configured as or otherwise support a means for receiving, at the interface controller, a set of data from the host device. In some examples, the VM ECC circuit 730 may be configured as or otherwise support a means for encoding, using the ECC circuit, a second codeword based at least in part on the set of data. In some examples, the VM transmission circuit 750 may be configured as or otherwise support a means for communicating the second codeword from the interface controller to the volatile memory.

In some examples, the NVM reception circuit 740 may be configured as or otherwise support a means for receiving a second codeword from a bank of the non-volatile memory. In some examples, the NVM ECC circuit 745 may be configured as or otherwise support a means for performing an error detection operation on the second codeword using a second ECC circuit included in the interface controller.

The NVM reception circuit 740 may be configured as or otherwise support a means for receiving a codeword from a bank of a non-volatile memory disposed on a first die. The NVM ECC circuit 745 may be configured as or otherwise support a means for performing an error detection operation on the codeword from the bank using an ECC circuit included in an interface controller that is disposed on a second die, the interface controller coupled with the non-volatile memory and a volatile memory operated as a cache for the non-volatile memory. In some examples, the host transmission circuit 735 may be configured as or otherwise support a means for communicating data bits of the codeword from the interface controller to a host device based at least in part on performing the error detection operation.

In some examples, the NVM ECC circuit 745 may be configured as or otherwise support a means for detecting an error in the codeword based at least in part performing the error detection operation. In some examples, the NVM ECC circuit 745 may be configured as or otherwise support a means for correcting the error using the ECC circuit before communicating the data bits of the codeword to the host device.

In some examples, the NVM reception circuit 740 may be configured as or otherwise support a means for receiving a second codeword from a second bank of the non-volatile memory. In some examples, the NVM ECC circuit 745 may be configured as or otherwise support a means for performing an error detection operation on the second codeword from the second bank using the ECC circuit included in the interface controller.

In some examples, the host reception circuit 755 may be configured as or otherwise support a means for receiving, at the interface controller, a set of data from the host device. In some examples, the NVM ECC circuit 745 may be configured as or otherwise support a means for encoding, using the ECC circuit, a second codeword based at least in part on the set of data. In some examples, the NVM transmission circuit 760 may be configured as or otherwise support a means for communicating the second codeword from the interface controller to the non-volatile memory.

In some examples, the VM reception circuit 725 may be configured as or otherwise support a means for receiving a second codeword from a bank of the volatile memory. In some examples, the VM ECC circuit 730 may be configured as or otherwise support a means for performing an error detection operation on the second codeword using a second ECC circuit included in the interface controller.

Figure 8:
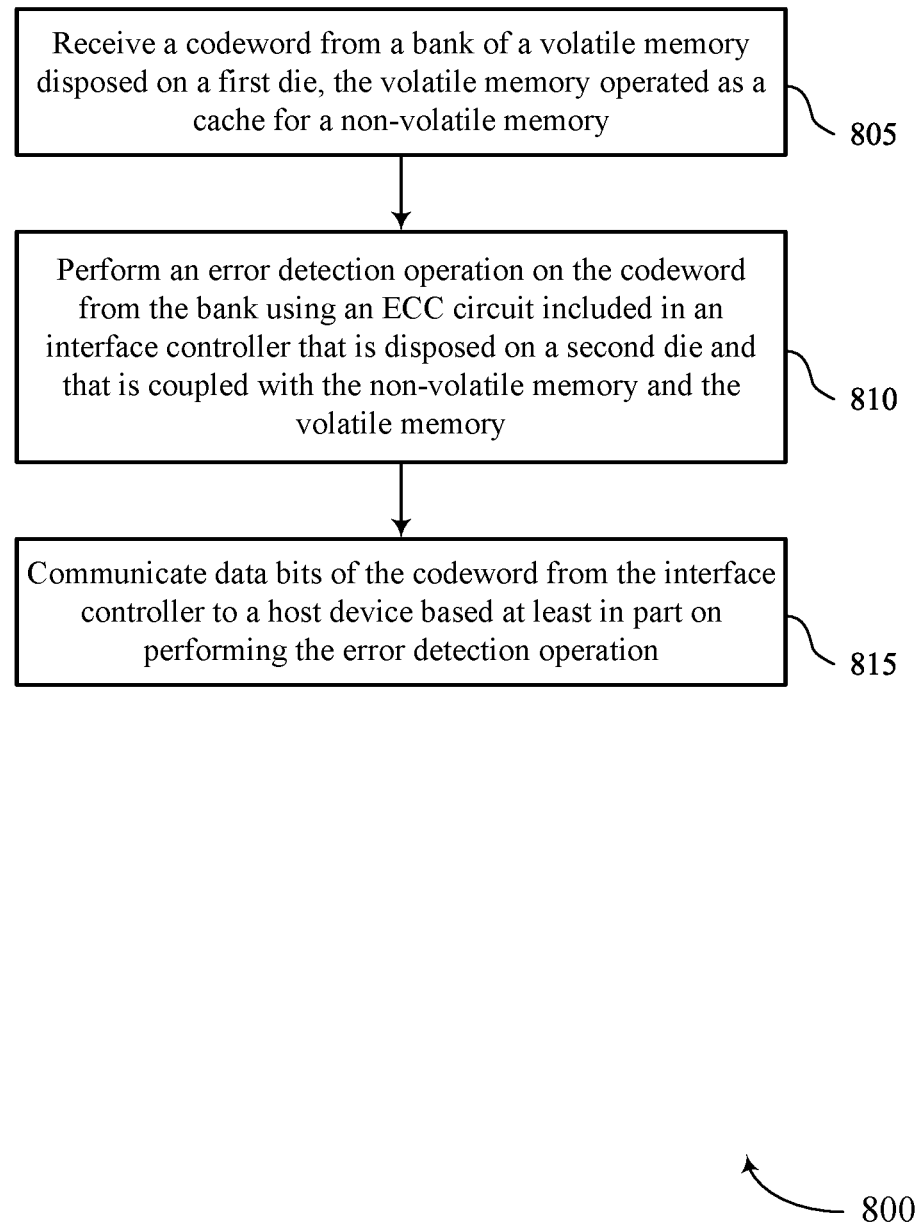
FIGS. 8 and 9 show flowcharts illustrating a method or methods that support centralized error correction circuit in accordance with examples as disclosed herein.

FIG. 8 shows a flowchart illustrating a method 800 that supports centralized error correction circuit in accordance with examples as disclosed herein. The operations of method 800 may be implemented by an interface controller or its components as described herein. For example, the operations of method 800 may be performed by an interface controller as described with reference to FIGS. 1 through 7. In some examples, an interface controller may execute a set of instructions to control the functional elements of the device to perform the described functions. Additionally or alternatively, the interface controller may perform aspects of the described functions using special-purpose hardware.

At 805, the method may include receiving a codeword from a bank of a volatile memory disposed on a first die, the volatile memory operated as a cache for a non-volatile memory. The operations of 805 may be performed in accordance with examples as disclosed herein. In some examples, aspects of the operations of 805 may be performed by a VM reception circuit 725 as described with reference to FIG. 7.

At 810, the method may include performing an error detection operation on the codeword from the bank using an ECC circuit included in an interface controller that is disposed on a second die and that is coupled with the non-volatile memory and the volatile memory. The operations of 810 may be performed in accordance with examples as disclosed herein. In some examples, aspects of the operations of 810 may be performed by a VM ECC circuit 730 as described with reference to FIG. 7.

At 815, the method may include communicating data bits of the codeword from the interface controller to a host device based at least in part on performing the error detection operation. The operations of 815 may be performed in accordance with examples as disclosed herein. In some examples, aspects of the operations of 815 may be performed by a host transmission circuit 735 as described with reference to FIG. 7.

In some examples, an apparatus as described herein may perform a method or methods, such as the method 800. The apparatus may include, features, circuitry, logic, means, or instructions (e.g., a non-transitory computer-readable medium storing instructions executable by a processor) for receiving a codeword from a bank of a volatile memory disposed on a first die, the volatile memory operated as a cache for a non-volatile memory, performing an error detection operation on the codeword from the bank using an ECC circuit included in an interface controller that is disposed on a second die and that is coupled with the non-volatile memory and the volatile memory, and communicating data bits of the codeword from the interface controller to a host device based at least in part on performing the error detection operation.

Some examples of the method 800 and the apparatus described herein may further include operations, features, circuitry, logic, means, or instructions for detecting an error in the codeword based at least in part performing the error detection operation and correcting the error using the ECC circuit before communicating the data bits of the codeword to the host device.

Some examples of the method 800 and the apparatus described herein may further include operations, features, circuitry, logic, means, or instructions for receiving a second codeword from a second bank of the volatile memory and performing an error detection operation on the second codeword from the second bank using the ECC circuit included in the interface controller.

In some examples of the method 800 and the apparatus described herein, the codeword includes a set of data bits including the data bits and the method, apparatuses, and non-transitory computer-readable medium may include further operations, features, circuitry, logic, means, or instructions for modifying, by the interface controller, a subset of data bits of the set of data bits after the error detection operation may be performed, encoding, by the interface controller, the set of data bits after updating the subset of data bits to generate an updated codeword, and communicating the updated codeword from the interface controller to the volatile memory for storage.

Some examples of the method 800 and the apparatus described herein may further include operations, features, circuitry, logic, means, or instructions for receiving, at the interface controller, a set of data from the host device, encoding, using the ECC circuit, a second codeword based at least in part on the set of data, and communicating the second codeword from the interface controller to the volatile memory.

Some examples of the method 800 and the apparatus described herein may further include operations, features, circuitry, logic, means, or instructions for receiving a second codeword from a bank of the non-volatile memory and performing an error detection operation on the second codeword using a second ECC circuit included in the interface controller.

Figure 9:
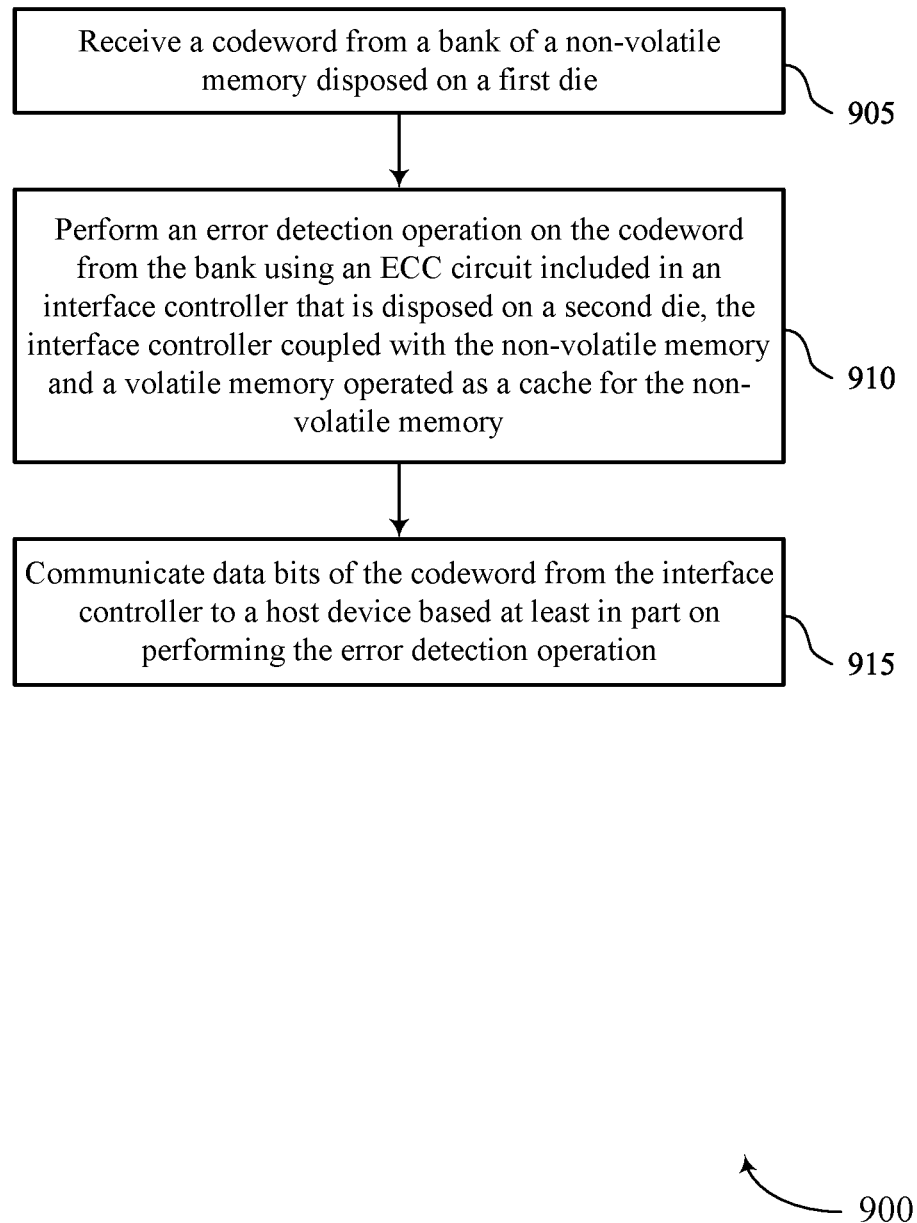

FIG. 9 shows a flowchart illustrating a method 900 that supports centralized error correction circuit in accordance with examples as disclosed herein. The operations of method 900 may be implemented by an interface controller or its components as described herein. For example, the operations of method 900 may be performed by an interface controller as described with reference to FIGS. 1 through 7. In some examples, an interface controller may execute a set of instructions to control the functional elements of the device to perform the described functions. Additionally or alternatively, the interface controller may perform aspects of the described functions using special-purpose hardware.

At 905, the method may include receiving a codeword from a bank of a non-volatile memory disposed on a first die. The operations of 905 may be performed in accordance with examples as disclosed herein. In some examples, aspects of the operations of 905 may be performed by an NVM reception circuit 740 as described with reference to FIG. 7.

At 910, the method may include performing an error detection operation on the codeword from the bank using an ECC circuit included in an interface controller that is disposed on a second die, the interface controller coupled with the non-volatile memory and a volatile memory operated as a cache for the non-volatile memory. The operations of 910 may be performed in accordance with examples as disclosed herein. In some examples, aspects of the operations of 910 may be performed by an NVM ECC circuit 745 as described with reference to FIG. 7.

At 915, the method may include communicating data bits of the codeword from the interface controller to a host device based at least in part on performing the error detection operation. The operations of 915 may be performed in accordance with examples as disclosed herein. In some examples, aspects of the operations of 915 may be performed by a host transmission circuit 735 as described with reference to FIG. 7.

In some examples, an apparatus as described herein may perform a method or methods, such as the method 900. The apparatus may include, features, circuitry, logic, means, or instructions (e.g., a non-transitory computer-readable medium storing instructions executable by a processor) for receiving a codeword from a bank of a non-volatile memory disposed on a first die, performing an error detection operation on the codeword from the bank using an ECC circuit included in an interface controller that is disposed on a second die, the interface controller coupled with the non-volatile memory and a volatile memory operated as a cache for the non-volatile memory, and communicating data bits of the codeword from the interface controller to a host device based at least in part on performing the error detection operation.

Some examples of the method 900 and the apparatus described herein may further include operations, features, circuitry, logic, means, or instructions for detecting an error in the codeword based at least in part performing the error detection operation and correcting the error using the ECC circuit before communicating the data bits of the codeword to the host device.

Some examples of the method 900 and the apparatus described herein may further include operations, features, circuitry, logic, means, or instructions for receiving a second codeword from a second bank of the non-volatile memory and performing an error detection operation on the second codeword from the second bank using the ECC circuit included in the interface controller.

Some examples of the method 900 and the apparatus described herein may further include operations, features, circuitry, logic, means, or instructions for receiving, at the interface controller, a set of data from the host device, encoding, using the ECC circuit, a second codeword based at least in part on the set of data, and communicating the second codeword from the interface controller to the non-volatile memory.

Some examples of the method 900 and the apparatus described herein may further include operations, features, circuitry, logic, means, or instructions for receiving a second codeword from a bank of the volatile memory and performing an error detection operation on the second codeword using a second ECC circuit included in the interface controller.

It should be noted that the methods described herein describe possible implementations, and that the operations and the steps may be rearranged or otherwise modified and that other implementations are possible. Further, portions from two or more of the methods may be combined.

An apparatus is described. The apparatus may include a non-volatile memory disposed on a first die, a volatile memory disposed on a second die and configured to operate as a cache for the non-volatile memory, the volatile memory including a plurality of banks, and an interface controller disposed on a third die and coupled with the non-volatile memory and the volatile memory, the interface controller including an ECC circuit that is coupled with the volatile memory and that is configured to operate on one or more codewords received from the volatile memory In some examples of the apparatus, the ECC circuit includes an encoder circuit configured to encode codewords for storage in the volatile memory and a decoder circuit to decode codewords received from the volatile memory.

In some examples of the apparatus, the volatile memory includes an I/O circuit configured to communicate uncorrected codewords to the interface controller and to receive codewords from the interface controller.

In some examples, the apparatus may include a second ECC circuit included in the interface controller, the second ECC circuit coupled with the non-volatile memory and configured to operate on codewords received from the non-volatile memory.

In some examples of the apparatus, the second ECC circuit includes an encoder circuit configured to encode codewords for storage in the non-volatile memory and a decoder circuit to decode codewords received from the non-volatile memory.

In some examples of the apparatus, the non-volatile memory includes an I/O circuit configured to communicate uncorrected codewords to the interface controller and receive codewords from the interface controller.

In some examples of the apparatus, the first die, the second die, and the third die may be included in a same package.

Another apparatus is described. The apparatus may include a non-volatile memory disposed on a first die, the non-volatile memory including a plurality of banks, a volatile memory disposed on a second die and configured to operate as a cache for the non-volatile memory, and an interface controller disposed on a third die and coupled with the non-volatile memory and the volatile memory, the interface controller including a ECC circuit that is coupled with the non-volatile memory and that is configured to operate on one or more codewords received from the non-volatile memory In some examples of the apparatus, the ECC circuit includes an encoder circuit configured to encode codewords for storage in the non-volatile memory and a decoder circuit to decode codewords received from the non-volatile memory.

In some examples of the apparatus, the volatile memory includes an I/O circuit configured to communicate uncorrected codewords to the interface controller and to receive codewords from the interface controller.

In some examples, the apparatus may include a second ECC circuit included in the interface controller, the second ECC circuit coupled with the volatile memory and configured to operate on codewords received from the volatile memory.

In some examples of the apparatus, the second ECC circuit includes an encoder circuit configured to encode codewords for storage in the volatile memory and a decoder circuit to decode codewords received from the volatile memory.

In some examples of the apparatus, the volatile memory includes an I/O circuit configured to communicate uncorrected codewords to the interface controller and receive codewords from the interface controller.

In some examples of the apparatus, the first die, the second die, and the third die may be included in a same package.

It should be noted that the methods described above describe possible implementations, and that the operations and the steps may be rearranged or otherwise modified and that other implementations are possible. Furthermore, portions from two or more of the methods may be combined.

If used to describe a conditional action or process, the terms "if," "when," "based on," "based at least in part on," and "in response to," may be interchangeable.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

A protocol may define one or more communication procedures and one or more communication parameters supported for use by a device or component. For example, a protocol may define various operations, a timing and a frequency for those operations, a meaning of various commands or signals or both, one or more addressing scheme(s) for one or more memories, a type of communication for which pins are reserved, a size of data handled at various components such as interfaces, a data rate supported by various components such as interfaces, or a bandwidth supported by various components such as interfaces, among other parameters and metrics, or any combination thereof. Use of a shared protocol may enable interaction between devices because each device may operate in a manner expected, recognized, and understood by another device. For example, two devices that support the same protocol may interact according to the policies, procedures, and parameters defined by the protocol, whereas two devices that support different protocols may be incompatible.

To illustrate, two devices that support different protocols may be incompatible because the protocols define different addressing schemes (e.g., different quantities of address bits). As another illustration, two devices that support different protocols may be incompatible because the protocols define different transfer procedures for responding to a single command (e.g., the burst length or quantity of bytes permitted in response to the command may differ). Merely translating a command to an action should not be construed as use of two different protocols. Rather, two protocols may be considered different if corresponding procedures or parameters defined by the protocols vary. For example, a device may be said to support two different protocols if the device supports different addressing schemes, or different transfer procedures for responding to a command.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate.

The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
  a non-volatile memory disposed on a first die;

a volatile memory disposed on a second die different than the first die and configured to operate as a cache for the non-volatile memory, the volatile memory comprising a plurality of banks; and an interface controller disposed on a third die different than the first die and different than the second die and coupled with the non-volatile memory and the volatile memory, the interface controller comprising an error correction code (ECC) circuit, comprising an ECC decoder, that is coupled with the non-volatile memory and the volatile memory, the ECC decoder configured to:

perform a first error detection operation on a first codeword, received from the non-volatile memory, that comprises first data for transfer from the non-volatile memory to the volatile memory; and perform a second error detection operation on a second codeword, received from the volatile memory, that comprises second data for transfer from the volatile memory to the non-volatile memory.

2. The apparatus of claim 1, wherein the ECC circuit comprises:

an encoder circuit configured to encode codewords for storage in the volatile memory and the non-volatile memory; and the ECC decoder configured to decode codewords received from the volatile memory and the non-volatile memory.

3. The apparatus of claim 1, wherein the volatile memory comprises:

an input/output (I/O) circuit configured to communicate uncorrected codewords to the interface controller and to receive codewords from the interface controller.

4. The apparatus of claim 1, wherein the non-volatile memory comprises:

an input/output (I/O) circuit configured to communicate uncorrected codewords to the interface controller and receive codewords from the interface controller.

5. The apparatus of claim 1, wherein the first die, the second die, and the third die are included in a same package.

6. A method, comprising:

receiving, at an interface controller that is disposed on a second die, a first codeword from a bank of a volatile memory disposed on a first die, the first codeword comprising first data from transfer from the volatile memory to a non-volatile memory;

receiving, at the interface controller, a second codeword comprising second data from transfer from the non-volatile memory to the volatile memory, the second codeword received from a bank of the non-volatile memory disposed on a third die, wherein the volatile memory is operated as a cache for the non-volatile memory, wherein the first die, the second die, and the third die are different from one another, and wherein the interface controller is coupled with the volatile memory and the non-volatile memory;

performing, at a decoder of an error correction code (ECC) circuit included in the interface controller, a first error detection operation on the first codeword comprising the first data for transfer from the volatile memory to the non-volatile memory and performing, at the decoder, a second error detection operation on the second codeword comprising the second data for transfer from the non-volatile memory to the volatile memory; and communicating, by the interface controller, data bits of the first data of the first codeword to the non-volatile memory based at least in part on performing the first error detection operation, and data bits of the second data of the second codeword to the volatile memory based at least in part on performing the second error detection operation.

7. The method of claim 6, further comprising:

detecting an error in the first codeword based at least in part performing the first error detection operation; and correcting the error using the ECC circuit before communicating the data bits of the first data to the non-volatile memory.

8. The method of claim 6, further comprising:

receiving a third codeword from a second bank of the volatile memory; and performing a third error detection operation on the third codeword received from the second bank using the ECC circuit included in the interface controller.

9. The method of claim 8, wherein the third codeword comprises a set of data bits, the method further comprising:

modifying, by the interface controller, a subset of data bits of the set of data bits after the third error detection operation is performed;

encoding, by the interface controller, the set of data bits after updating the subset of data bits to generate an updated codeword; and communicating the updated codeword from the interface controller to the volatile memory for storage.

10. The method of claim 6, further comprising:

receiving, at the interface controller, a set of data from a host device;

encoding, using the ECC circuit, a third codeword based at least in part on the set of data; and communicating the third codeword from the interface controller to the volatile memory.

11. An apparatus, comprising:

a non-volatile memory disposed on a first die, the non-volatile memory comprising a plurality of banks;

a volatile memory disposed on a second die that is different than the first die and configured to operate as a cache for the non-volatile memory; and an interface controller disposed on a third die different than the first die and different than the second die and coupled with the non-volatile memory and the volatile memory, the interface controller comprising:

a first error correction code (ECC) decoder that is coupled with the non-volatile memory and that is configured to perform a first error detection operation of a first codeword received from the non-volatile memory, the first codeword comprising first data for transfer from the non-volatile memory to the volatile memory; and a second ECC decoder that is coupled with the volatile memory and that is configured to perform a second error detection operation on a second codeword received from the volatile memory, the second codeword comprising second data for transfer from the volatile memory to the non-volatile memory.

12. The apparatus of claim 11, wherein the interface controller further comprises:

an encoder circuit configured to encode codewords for storage in the non-volatile memory.

13. The apparatus of claim 11, wherein the volatile memory comprises:

an input/output (I/O) circuit configured to communicate uncorrected codewords to the interface controller and to receive codewords from the interface controller.

14. The apparatus of claim 11, wherein the interface controller further comprises:
an encoder circuit configured to encode codewords for storage in the volatile memory.

15. The apparatus of claim 11, wherein the non-volatile memory comprises:
an input/output (I/O) circuit configured to communicate uncorrected codewords to the interface controller and receive codewords from the interface controller.

16. The apparatus of claim 11, wherein the first die, the second die, and the third die are included in a same package.

17. A method, comprising:
receiving, at an interface controller that is disposed on a second die, a first codeword from a bank of a non-volatile memory disposed on a first die, the first codeword comprising first data for transfer from the non-volatile memory to a volatile memory;
receiving, at the interface controller from a bank of the volatile memory disposed on a third die, wherein the volatile memory is operated as a cache for the non-volatile memory, a second codeword comprising second data for transfer from the volatile memory to the non-volatile memory, wherein the first die, the second die, and the third die are different from one another, and wherein the interface controller is coupled with the non-volatile memory and the volatile memory;
performing, at a first ECC decoder included in the interface controller, a first error detection operation on the first codeword comprising the first data for transfer from the non-volatile memory to the volatile memory;
performing, at a second ECC decoder included in the interface controller, a second error detection operation on the second codeword comprising second data for transfer from the volatile memory to the non-volatile memory; and
communicating, by the interface controller, the first data of the first codeword to the volatile memory based at least in part on performing the first error detection operation, and the second data of the second codeword to the non-volatile memory based at least in part on performing the second error detection operation.

18. The method of claim 17, further comprising:
detecting an error in the first codeword based at least in part performing the first error detection operation; and
correcting the error using the first ECC decoder before communicating the first data of the first codeword to the volatile memory.

19. The method of claim 17, further comprising:
receiving a third codeword from a second bank of the non-volatile memory; and
performing a third error detection operation on the third codeword received from the second bank of the non-volatile memory using the first ECC decoder included in the interface controller.

20. The method of claim 17, further comprising:
receiving, at the interface controller, a set of data from a host device;
encoding, using an ECC encoder, a third codeword based at least in part on the set of data; and
communicating the third codeword from the interface controller to the non-volatile memory.

* * * * *